United States Patent
Nakashima et al.

(10) Patent No.: US 12,325,770 B2
(45) Date of Patent: Jun. 10, 2025

(54) RESIN COMPOSITION, CURED PRODUCT, PREPREG, METAL FOIL-CLAD LAMINATE, RESIN SHEET, AND PRINTED WIRING BOARD

(71) Applicant: Mitsubishi Gas Chemical Company, Inc, Tokyo (JP)

(72) Inventors: Yuji Nakashima, Tokyo (JP); Takashi Kobayashi, Tokyo (JP); Shunsuke Hirano, Tokyo (JP); Keiichi Hasebe, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 18/685,865

(22) PCT Filed: Aug. 5, 2022

(86) PCT No.: PCT/JP2022/030138
§ 371 (c)(1),
(2) Date: Feb. 22, 2024

(87) PCT Pub. No.: WO2023/026829
PCT Pub. Date: Mar. 2, 2023

(65) Prior Publication Data
US 2024/0376243 A1 Nov. 14, 2024

(30) Foreign Application Priority Data
Aug. 25, 2021 (JP) ................................ 2021-136790

(51) Int. Cl.
*C08F 257/02* (2006.01)
*C08J 5/24* (2006.01)
*C08K 5/315* (2006.01)
*C08L 51/00* (2006.01)
*H05K 1/03* (2006.01)

(52) U.S. Cl.
CPC ............. *C08F 257/02* (2013.01); *C08J 5/249* (2021.05); *C08K 5/315* (2013.01); *C08L 51/003* (2013.01); *H05K 1/0366* (2013.01); *C08J 2351/06* (2013.01); *C08J 2451/08* (2013.01); *C08J 2453/02* (2013.01)

(58) Field of Classification Search
CPC .................................................. B32B 15/088
See application file for complete search history.

(56) References Cited

U.S. PATENT DOCUMENTS

| | | |
|---|---|---|
| 2009/0203279 A1 | 8/2009 | Mori et al. |
| 2014/0235126 A1 | 8/2014 | Mori et al. |
| 2023/0331944 A1 | 10/2023 | Saito et al. |

FOREIGN PATENT DOCUMENTS

| | | | |
|---|---|---|---|
| CN | 113121999 A | | 7/2021 |
| JP | 2002363232 A | * | 12/2002 |
| JP | 2007262191 A | * | 10/2007 |
| JP | 2010-138364 A | | 6/2010 |
| JP | 2019-194307 A1 | | 11/2019 |
| WO | 2020/175537 A1 | | 9/2020 |
| WO | 2020/175538 A1 | | 9/2020 |
| WO | 2020/217674 A1 | | 10/2020 |
| WO | 2020/217675 A1 | | 10/2020 |
| WO | 2020/217677 A1 | | 10/2020 |
| WO | 2022/054867 A1 | | 3/2022 |

OTHER PUBLICATIONS

Machine translation of JP-2002363232-A (Year: 2002).*
JP-2007262191-A (Year: 2007).*
International Search Report for the corresponding International Application No. PCT/JP2022/030138 dated Oct. 11, 2022 (9 pp).
International Preliminary Report for the corresponding International Application No. PCT/JP2022/030138 dated February, 2, 2024 (5 pp).
Extended European Search Report dated Oct. 29, 2024 for related EP application 22861119.0 (7 pp).

* cited by examiner

*Primary Examiner* — Ian A Rummel
(74) *Attorney, Agent, or Firm* — Renner, Kenner; Arthur M. Reginelli

(57) ABSTRACT

Provided are a resin composition having low dielectric constants and low dielectric loss tangents before moisture absorption (initial state) and after moisture absorption with high metal foil peel strength; and a cured product, a prepreg, a metal foil-clad laminate, a resin sheet, and a printed wiring board in which the resin composition is used. The resin composition contains a compound (A) represented by Formula (M1) and a polymer (B) having a structural unit represented by Formula (V).

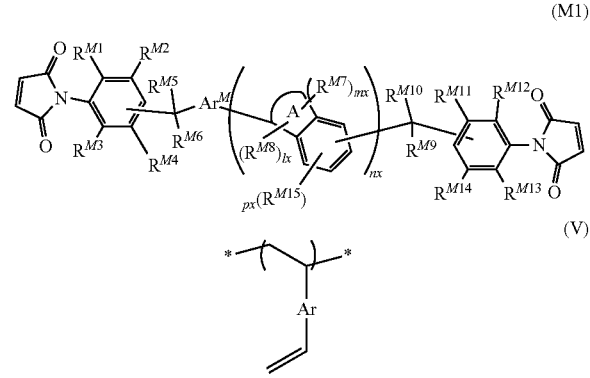

19 Claims, No Drawings

RESIN COMPOSITION, CURED PRODUCT, PREPREG, METAL FOIL-CLAD LAMINATE, RESIN SHEET, AND PRINTED WIRING BOARD

TECHNICAL FIELD

The present invention relates to a resin composition, a cured product, a prepreg, a metal foil-clad laminate, a resin sheet, and a printed wiring board.

BACKGROUND ART

In recent years, semiconductors used in equipment such as communication tools, communication devices, and personal computers have become highly integrated and grown extremely smaller in size, and along with such a tread, various properties required for printed wiring boards (e.g., metal foil-clad laminates) for use in such equipment have become increasingly stringent. Examples of the main properties required include metal foil peel strength, low water absorption, desmear resistance, flame resistance, low dielectric constant, low dielectric loss tangent, low thermal expansion properties, and thermal resistance.

To obtain a printed wiring board having each of these property improved, resin compositions used as a material for the printed wiring board have been studied. For example, Patent Document 1 discloses a resin composition for a printed wiring board, the composition containing a bifunctional vinylbenzyl compound (a) containing a given polyphenylene ether skeleton, a predetermined maleimide compound (b), a predetermined cyanate ester resin (c), and a predetermined epoxy resin (d).

Patent Document 2 discloses a resin composition containing a polyfunctional vinyl aromatic polymer (A) and a thermosetting compound (B), but not containing a radical polymerization initiator. Further, Patent Document 2 describes that the polyfunctional vinyl aromatic polymer (A) is a polymer having a structural unit represented by Formula (V);

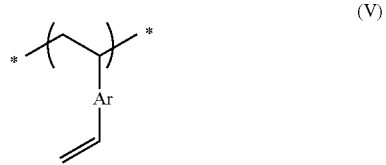

(V)

where Ar represents an aromatic hydrocarbon linking group, and represents a bond position.

CITATION LIST

Patent Documents

Patent Document 1: JP 2010-138364 A
Patent Document 2: WO 2020/175537

SUMMARY OF INVENTION

Technical Problem

Although various properties in printed wiring boards have been improved by developing materials including the examples described above, further improvements in performance are desired in view of the progress of the technology and the expansion of the application. Particularly in recent years, materials having high metal foil peel strength while having a low dielectric constant and a low dielectric loss tangent have been in demand. In addition, a material having excellent dielectric properties after moisture absorption is desired.

The present invention is intended to solve the issues described above, and an object of the present invention is to provide a resin composition having low dielectric constants and low dielectric loss tangents before moisture absorption (initial state) and after moisture absorption with high metal foil peel strength; and a cured product, a prepreg, a metal foil-clad laminate, a resin sheet, and a printed wiring board in which the resin composition is used.

Solution to Problem

To solve the above issues, the present inventors have investigated component compositions of resin compositions such as prepregs that are particularly suited for applications in printed wiring boards, and, as a result, found that a resin composition in which a predetermined maleimide compound and a predetermined polyfunctional vinyl aromatic polymer are combined may solve the above issues. Specifically, the issues described above are solved by the following solutions.

<1> A resin composition containing a compound (A) represented by Formula (M1) and a polymer (B) having a structural unit represented by Formula (V);

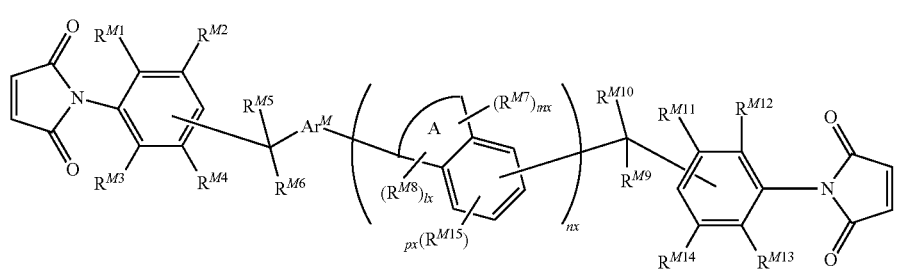

(M1)

where in Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four- to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; $R^{M15}$ each independently represents an alkyl group having from 1 to 10 carbon atom(s), an alkyloxy group having from 1 to 10 carbon atom(s), an alkylthio group having from 1 to 10 carbon atom(s), an aryl group having from 6 to 10 carbon atoms, an aryloxy group having from 1 to 10 carbon atom(s), an arylthio group having from 1 to 10 carbon atom(s), a halogen atom, a hydroxyl group, or a mercapto group; px represents an integer of from 0 to 3; and nx represents an integer of from 1 to 20,

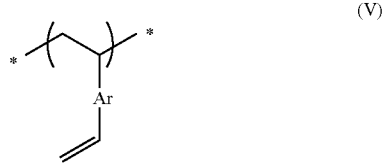

where in Formula (V), Ar represents an aromatic hydrocarbon linking group; and * represents a bond position.

(2) The resin composition according to (1), in which, when a resin solid content in the resin composition is defined as 100 parts by mass, a content of the compound (A) represented by Formula (M1) is from 1 to 90 parts by mass.

<3> The resin composition according to <1> or <2>, in which, when a resin solid content in the resin composition is defined as 100 parts by mass, a content of the polymer (B) having the structural unit represented by Formula (V) is from 1 to 90 parts by mass.

<4> The resin composition according to any one of <1> to <3>, which further contains at least one additional resin component (C) selected from the group consisting of; a maleimide compound other than the compound (A) represented by Formula (M1); an epoxy compound; a phenolic compound; an oxetane resin, a benzoxazine compound; a polyphenylene ether compound containing two or more unsaturated carbon-carbon double bonds; and a cyanate ester compound.

<5> The resin composition according to any one of <1> to <4>, which further contains a cyanate ester compound.

<6> The resin composition according to any one of <1> to <5>, which further contains a filler (D).

<7> The resin composition according to <6>, in which a content of the filler (D) in the resin composition is from 50 to 1600 parts by mass relative to 100 parts by mass of a resin solid content.

<8> The resin composition according to any one of <1> to <7>, in which a weight average molecular weight of the polymer (B) having the structural unit represented by Formula (V) is from 3000 to 130000.

<9> The resin composition according to any one of <1> to <8>, which further contains an elastomer.

<10> The resin composition according to any one of <1> to <9>, which does not contain a radical polymerization initiator.

<11> The resin composition according to any one of <1> to <10>, which is for a printed wiring board.

<12> The resin composition according to any one of <1> to <11>, in which
when a resin solid content in the resin composition is defined as 100 parts by mass, a content of the compound (A) represented by Formula (M1) is from 1 to 90 parts by mass, and
when a resin solid content in the resin composition is defined as 100 parts by mass, a content of the polymer (B) having the structural unit represented by Formula (V) is from 1 to 90 parts by mass.

<13> The resin composition according to any one of <1> to <12>, in which
when a resin solid content in the resin composition is defined as 100 parts by mass, a content of the compound (A) represented by Formula (M1) is from 1 to 90 parts by mass;
when a resin solid content in the resin composition is defined as 100 parts by mass, a content of the polymer (B) having the structural unit represented by Formula (V) is from 1 to 90 parts by mass;
the resin composition further contains at least one additional resin component (C) selected from the group consisting of; a maleimide compound other than the compound (A) represented by Formula (M1); an epoxy compound; a phenolic compound; an oxetane resin, a benzoxazine compound; a polyphenylene ether compound containing two or more unsaturated carbon-carbon double bonds; and a cyanate ester compound; and
a weight average molecular weight of the polymer (B) having the structural unit represented by Formula (V) is from 3000 to 130000.

<14> The resin composition according to any one of <1> to <13>, which further contains an elastomer.

<15> The resin composition according to any one of <1> to <14>, which does not contain a radical polymerization initiator.

<16> The resin composition according to any one of <1> to <15>, in which the polymer (B) having the structural unit represented by Formula (V) has (Mw/Mn), a monodispersity represented by a ratio of a weight average molecular weight Mw to a number average molecular weight Mn, of 10 or more and 20 or less.

<17> A cured product of a resin composition described in any one of <1> to <16>.

<18> A prepreg including a substrate and a resin composition described in any one of <1> to <16>.

<19> A metal foil-clad laminate including at least one prepreg described in <18> and a metal foil disposed on one side or both sides of the prepreg.

<20> A resin sheet including a layer including a support and a resin composition described in any one of <1> to <16> disposed on a surface of the support.

<21> A printed wiring board including an insulating layer and a conductor layer disposed on a surface of the insulating layer, in which the insulating layer includes a layer including a resin composition described in any one of <1> to <16>.

<22> A semiconductor device including a printed wiring board described in <21>.

Advantageous Effects of Invention

The present invention has made it possible to provide a resin composition having low dielectric constants and low dielectric loss tangents before moisture absorption (initial state) and after moisture absorption with high metal foil peel strength; and a cured product, a prepreg, a metal foil-clad laminate, a resin sheet, and a printed wiring board in which the resin composition is used.

DESCRIPTION OF EMBODIMENTS

Hereinafter, embodiments for carrying out the present invention (referred to simply as "the present embodiments" below) will be described in detail. Note that the following embodiments are examples for describing the present invention, and the present invention is not limited to these embodiments.

In the present specification, "from . . . to . . . " or "of . . . to . . . " is used to mean that the numerical values described before and after "to" are included as the lower limit and the upper limit, respectively.

In the present specification, various physical property values and characteristic values are values at 23° C. unless otherwise noted.

In a description of a group (atomic group) in the present specification, a description not specifying whether the group is a substituted group or an unsubstituted group is meant to include a group (atomic group) having a substituent as well as a group (atomic group) having no substituent. For example, an "alkyl group" includes not only an alkyl group having no substituent (unsubstituted alkyl group) but also an alkyl group having a substituent (substituted alkyl group). In the present specification, a description not specifying whether the group is a substituted group or an unsubstituted group means that the group is preferably an unsubstituted group.

When a measurement method or the like of a standard set forth in the present specification differs depending on the year, it is based on the standard as of Jan. 1, 2021, unless otherwise stated.

In the present specification, the relative dielectric constant refers to a ratio of the dielectric constant of a substance to the dielectric constant of vacuum. In the present specification, the relative dielectric constant is sometimes simply referred to as "dielectric constant".

In the present specification, "(meth)acrylic" represents both or either one of acrylic and methacrylic.

In the present specification, "resin solid content" refers to components excluding a filler and a solvent and is intended to include a compound (A) represented by Formula (M1) and a polymer (B) having a structural unit represented by Formula (V), as well as an additional resin component (C), an elastomer, a silane coupling agent, and an additional resin additive component (an additive, such as a flame retardant) that are blended as necessary.

A resin composition according to the present embodiments is characterized by containing a compound (A) represented by Formula (M1) and a polymer (B) having a structural unit represented by Formula (V);

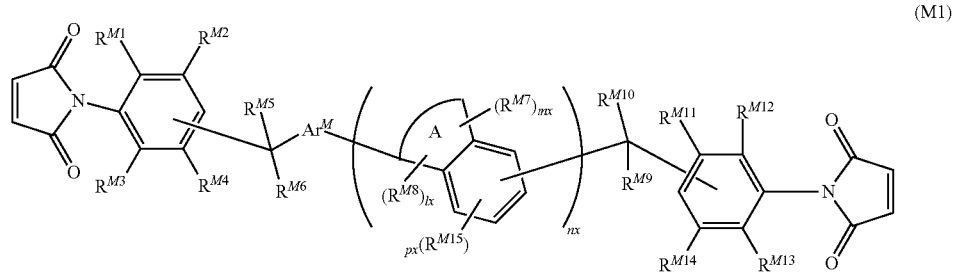

(M1)

where in Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four- to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; $R^{M15}$ each independently represents an alkyl group having from 1 to 10 carbon atom(s), an alkyloxy group having from 1 to 10 carbon atom(s), an alkylthio group having from 1 to 10 carbon atom(s), an aryl group having from 6 to 10 carbon atoms, an aryloxy group having from 1 to 10 carbon atom(s), an arylthio group having from 1 to 10 carbon atom(s), a halogen atom, a hydroxyl group, or a mercapto group; px represents an integer of from 0 to 3; and nx represents an integer of from 1 to 20,

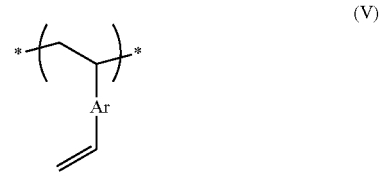

(V)

where in Formula (V), Ar represents an aromatic hydrocarbon linking group; and * represents a bond position.

Such a configuration can provide a resin composition having low dielectric constants and low dielectric loss tangents before moisture absorption (initial state) and after moisture absorption with high metal foil peel strength. Here, regarding the relative dielectric constant (Dk) of the resin composition, when a resin having a high Dk and a resin having a low Dk are mixed, the relative dielectric constant tends to correspond to the mass fraction. On the other hand, regarding the dielectric loss tangent (Df) of the resin composition, even when a resin having a high Df and a resin having a low Df are mixed, the dielectric loss tangent does not correspond to the mass fraction, in many cases. It is presumed that, when a resin having a high Df and a resin having a low Df are mixed, this tends to occur due to the resin having a high Df and the resin having a low Df being bonded to each other. On the other hand, in the present embodiments, it is presumed that the use of the compound (A) represented by Formula (M1) and the polymer (B) having the structural unit represented by Formula (V) could make it hard to form a resin in which both of them were bonded to each other. That is, it is presumed that, when the resin components were allowed to be easily bonded to each other, a cured product of the resin composition could successfully effectively exhibit the excellent low dielectric properties, particularly the Df and the dielectric properties after moisture absorption, which are originally possessed by the polymer (B) having the structural unit represented by Formula (V). Furthermore, it is presumed that the cured product of the resin composition could also effectively exhibit the excellent properties including metal foil peel strength, which are originally possessed by the compound (A) represented by Formula (M1).

In the present embodiments, it is presumed that, for example, in the compound (A) represented by Formula (M1), the resin components may be easily bonded to each other by adjusting the molecular skeleton such as the molecular structure around a reactive point. Furthermore, in the present embodiments, it is presumed that the adjustment of a molecular weight of the polymer (B) having the structural unit represented by Formula (V) may also further reduce a bonding probability thereof with the compound (A) represented by Formula (M1).

<Compound (A) Represented by Formula (M1)>

A resin composition according to the present embodiments contains a compound (A) represented by Formula (M1). With the resin composition containing the compound (A) represented by Formula (M1), a high metal foil peel strength can be achieved. Since it is hard to form a resin in which the compound (A) represented by Formula (M1) is bonded to the polymer (B) having the structural unit represented by Formula (V), the resulting cured product can effectively exhibit the low Df which is originally possessed by the polymer (B) having the structural unit represented by Formula (V);

where in Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four-to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; $R^{M15}$ each independently represents an alkyl group having from 1 to 10 carbon atom(s), an alkyloxy group having from 1 to 10 carbon atom(s), an alkylthio group having from 1 to 10 carbon atom(s), an aryl group having from 6 to 10 carbon atoms, an aryloxy group having from 1 to 10 carbon atom(s), an arylthio group having from 1 to 10 carbon atom(s), a halogen atom, a hydroxyl group, or a mercapto group; px represents an integer of from 0 to 3; and nx represents an integer of from 1 to 20.

$R^{M1}$, $R^{M2}$, $R^{M3}$, and $R^{M4}$ in the formula each independently represent a hydrogen atom or an organic group. The organic group here is preferably an alkyl group, more preferably an alkyl group having from 1 to 12 carbon atom(s), even more preferably an alkyl group having from 1 to 6 carbon atom(s), still more preferably a methyl group, an ethyl group, a propyl group, or a butyl group, and particularly preferably a methyl group among them. $R^{M1}$ and $R^{M3}$ each independently are preferably alkyl groups, and $R^{M2}$ and $R^{M4}$ are preferably hydrogen atoms.

$R^{M5}$ and $R^{M6}$ each independently represent a hydrogen atom or an alkyl group and are preferably alkyl groups. The alkyl group here is preferably an alkyl group having from 1 to 12 carbon atom(s), more preferably an alkyl group having from 1 to 6 carbon atom(s), even more preferably a methyl group, an ethyl group, a propyl group, or a butyl group, and particularly preferably a methyl group among them.

$Ar^M$ represents a divalent aromatic group and is preferably a phenylene group, a naphthalenediyl group, a phenanthrenediyl group, or an anthracenediyl group, more preferably a phenylene group, and even more preferably a m-phenylene group. $Ar^M$ may have a substituent, and the substituent is preferably an alkyl group, more preferably an alkyl group having from 1 to 12 carbon atom(s), even more preferably an alkyl group having from 1 to 6 carbon atom(s), still more preferably a methyl group, an ethyl group, a propyl group, or a butyl group, and particularly preferably a methyl group. However, $Ar^M$ is preferably unsubstituted.

A is a four-to six-membered alicyclic group and more preferably a five-membered alicyclic group (preferably a group to form an indan ring with a benzene ring). $R^{M7}$ and $R^{M8}$ each independently are alkyl groups, preferably alkyl groups having from 1 to 6 carbon atom(s), more preferably

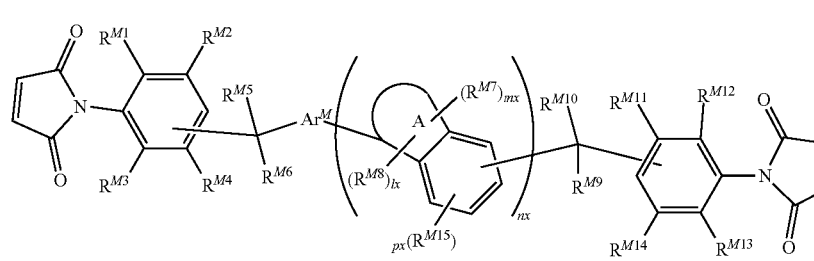

(M1)

alkyl groups having from 1 to 3 carbon atom(s), and particularly preferably methyl groups.

mx is 1 or 2 and preferably 2.

lx is 0 or 1 and preferably 1.

$R^{M9}$ and $R^{M10}$ each independently represent a hydrogen atom or an alkyl group and are more preferably alkyl groups. The alkyl group here is preferably an alkyl group having from 1 to 12 carbon atom(s), more preferably an alkyl group having from 1 to 6 carbon atom(s), even more preferably a methyl group, an ethyl group, a propyl group, or a butyl group, and particularly preferably a methyl group among them.

$R^{M11}$, $R^{M12}$, $R^{M13}$, and $R^{M14}$ each independently represent a hydrogen atom or an organic group. The organic group here is preferably an alkyl group, more preferably an alkyl group having from 1 to 12 carbon atom(s), even more preferably an alkyl group having from 1 to 6 carbon atom(s), still more preferably a methyl group, an ethyl group, a propyl group, or a butyl group, and particularly preferably a methyl group among them. $R^{M12}$ and $R^{M13}$ each independently are preferably alkyl groups, and $R^{M11}$ and $R^{M14}$ are preferably hydrogen atoms.

$R^{M15}$ each independently represents an alkyl group having from 1 to 10 carbon atom(s), an alkyloxy group having from 1 to 10 carbon atom(s), an alkylthio group having from 1 to 10 carbon atom(s), an aryl group having from 6 to 10 carbon atoms, an aryloxy group having from 1 to 10 carbon atom(s), an arylthio group having from 1 to 10 carbon atom(s), a halogen atom, a hydroxyl group, or a mercapto group, and is preferably an alkyl group having from 1 to 4 carbon atom(s), a cycloalkyl group having from 3 to 6 carbon atoms, or an aryl group having from 6 to 10 carbon atoms.

px represents an integer of from 0 to 3, and is preferably an integer of from 0 to 2, more preferably 0 or 1, and even more preferably 0.

nx represents an integer of from 1 to 20. nx may be an integer of 10 or less.

The resin composition of the present invention may contain only one compound (A) represented by Formula (M1) differing in the value of at least nx or may contain two or more compounds (A). When the resin composition contains two or more compounds (A), the average value (average repeating unit number) n of nx in the compound (A) represented by Formula (M1) in the resin composition is preferably 0.92 or greater, more preferably 0.95 or greater, even more preferably 1.0 or greater, and still more preferably 1.1 or greater, to lower the melting point (softening point), reduce the melt viscosity, and provide excellent handling properties. Also, n is preferably 10.0 or lower, more preferably 8.0 or lower, even more preferably 7.0 or lower, and still more preferably 6.0 or lower, and may be 5.0 or lower. The same applies to Formula (M1-1) which will be described below.

The compound (A) represented by Formula (M1) is preferably a compound represented by Formula (M1-1) below;

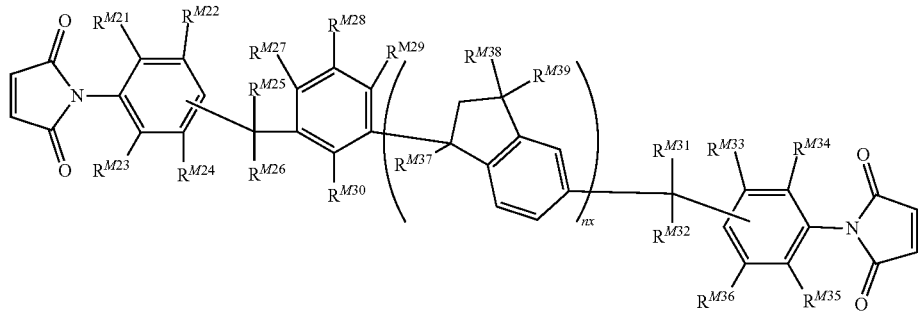

(M1-1)

where in Formula (M1-1), $R^{M21}$, $R^{M22}$, $R^{M23}$, and $R^{M24}$ each independently represent a hydrogen atom or an organic group; $R^{M25}$ and $R^{M26}$ each independently represent a hydrogen atom or an alkyl group; $R^{M27}$, $R^{M28}$, $R^{M29}$, and $R^{M30}$ each independently represent a hydrogen atom or an organic group; $R^{M31}$ and $R^{M32}$ each independently represent a hydrogen atom or an alkyl group; $R^{M33}$, $R^{M34}$, $R^{M35}$, and $R^{M36}$ each independently represent a hydrogen atom or an organic group; $R^{M37}$, $R^{M38}$, and $R^{M39}$ each independently represent a hydrogen atom or an alkyl group; and nx represents an integer of 1 or more and 20 or less.

$R^{M21}$, $R^{M22}$, $R^{M23}$, and $R^{M24}$ in the formula each independently represent a hydrogen atom or an organic group. The organic group here is preferably an alkyl group, more preferably an alkyl group having from 1 to 12 carbon atom(s), even more preferably an alkyl group having from 1 to 6 carbon atom(s), still more preferably a methyl group, an ethyl group, a propyl group, or a butyl group, and particularly preferably a methyl group. $R^{M21}$ and $R^{M23}$ are preferably alkyl groups, and $R^{M22}$ and $R^{M24}$ are preferably hydrogen atoms.

$R^{M25}$ and $R^{M26}$ each independently represent a hydrogen atom or an alkyl group and are preferably alkyl groups. The alkyl group here is preferably an alkyl group having from 1 to 12 carbon atom(s), more preferably an alkyl group having from 1 to 6 carbon atom(s), even more preferably a methyl group, an ethyl group, a propyl group, or a butyl group, and particularly preferably a methyl group among them.

$R^{M27}$, $R^{M28}$, $R^{M29}$, and $R^{M30}$ each independently represent a hydrogen atom or an organic group and are preferably hydrogen atoms. The organic group here is preferably an alkyl group, more preferably an alkyl group having from 1 to 12 carbon atom(s), even more preferably an alkyl group having from 1 to 6 carbon atom(s), still more preferably a methyl group, an ethyl group, a propyl group, or a butyl group, and particularly preferably a methyl group.

$R^{M31}$ and $R^{M32}$ each independently represent a hydrogen atom or an alkyl group and are preferably alkyl groups. The alkyl group here is preferably an alkyl group having from 1 to 12 carbon atom(s), more preferably an alkyl group having from 1 to 6 carbon atom(s), even more preferably a methyl group, an ethyl group, a propyl group, or a butyl group, and particularly preferably a methyl group among them.

$R^{M33}$, $R^{M34}$, $R^{M35}$, and $R^{M36}$ each independently represent a hydrogen atom or an organic group. The organic group here is preferably an alkyl group, more preferably an alkyl group having from 1 to 12 carbon atom(s), even more preferably an alkyl group having from 1 to 6 carbon atom(s), still more preferably a methyl group, an ethyl group, a propyl group, or a butyl group, and particularly preferably a methyl group.

$R^{M33}$ and $R^{M36}$ are preferably hydrogen atoms, and $R^{M34}$ and $R^{M35}$ are preferably alkyl groups.

$R^{M37}$, $R^{M38}$, and $R^{M39}$ each independently represent a hydrogen atom or an alkyl group and are preferably alkyl groups. The alkyl group here is preferably an alkyl group having from 1 to 12 carbon atom(s), more preferably an alkyl group having from 1 to 6 carbon atom(s), even more preferably a methyl group, an ethyl group, a propyl group, or a butyl group, and particularly preferably a methyl group among them.

nx represents an integer of 1 or more and 20 or less. nx may be an integer of 10 or less.

The compound represented by Formula (M1-1) is preferably a compound represented by Formula (M1-2) below;

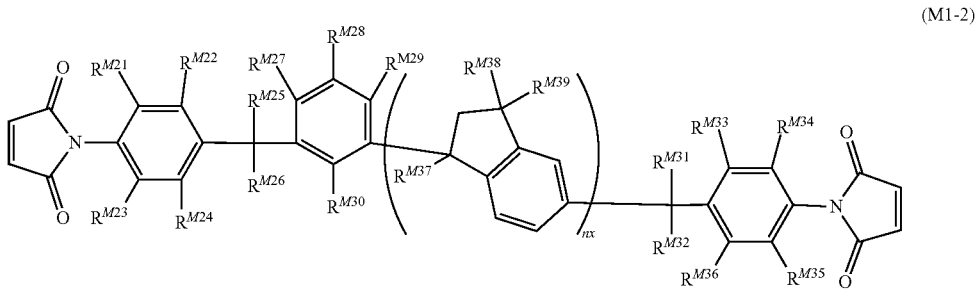

(M1-2)

where in Formula (M1-2), $R^{M21}$, $R^{M22}$, $R^{M23}$, and $R^{M24}$ each independently represent a hydrogen atom or an organic group; $R^{M25}$ and $R^{M26}$ each independently represent a hydrogen atom or an alkyl group; $R^{M27}$, $R^{M28}$, $R^{M29}$, and $R^{M30}$ each independently represent a hydrogen atom or an organic group; $R^{M31}$ and $R^{M32}$ each independently represent a hydrogen atom or an alkyl group; $R^{M33}$, $R^{M34}$, $R^{M35}$, and $R^{M36}$ each independently represent a hydrogen atom or an organic group; $R^{M37}$, $R^{M38}$, and $R^{M39}$ each independently represent a hydrogen atom or an alkyl group; and nx represents an integer of 1 or more and 20 or less.

In Formula (M1-2), $R^{M21}$, $R^{M22}$, $R^{M23}$, $R^{M24}$, $R^{M25}$, $R^{M26}$, $R^{M27}$, $R^{M28}$, $R^{M29}$, $R^{M30}$, $R^{M31}$, $R^{M32}$, $R^{M33}$, $R^{M34}$, $R^{M35}$, $R^{M36}$, $R^{M37}$, $R^{M38}$, $R^{M39}$, and nx have the same meanings as $R^{M21}$, $R^{M22}$, $R^{M23}$, $R^{M24}$, $R^{M25}$, $R^{M26}$, $R^{M27}$, $R^{M28}$, $R^{M29}$, $R^{M30}$, $R^{M31}$, $R^{M32}$, $R^{M33}$, $R^{M34}$, $R^{M35}$, $R^{M36}$, $R^{M37}$, $R^{M38}$, $R^{M39}$, and nx, respectively, in Formula (M1-1), and preferred ranges thereof are also the same.

Further, the compound represented by Formula (M1-1) is preferably a compound represented by Formula (M1-3) below, and more preferably a compound represented by Formula (M1-4) below;

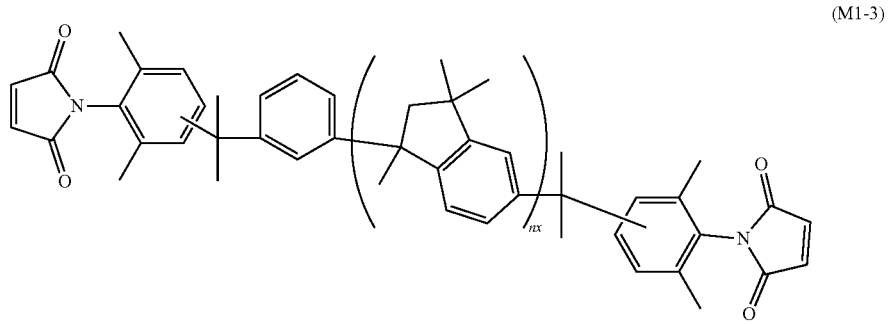

(M1-3)

where in Formula (M1-3), nx represents an integer of 1 or more and 20 or less.

nx may be an integer of 10 or less,

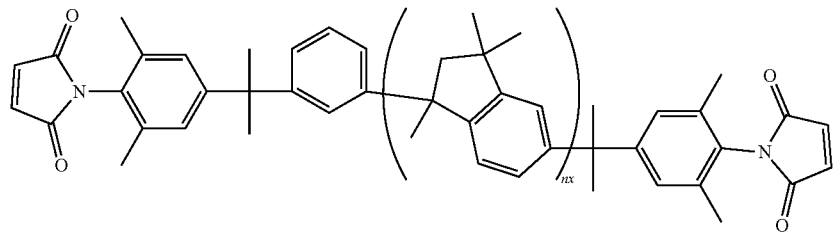

(M1-4)

where in Formula (M1-4), nx represents an integer of 1 or more and 20 or less.

The molecular weight of the compound (A) represented by Formula (M1) is preferably 500 or greater, more preferably 600 or greater, and even more preferably 700 or greater. With the total amount of the compound (A) and the compound (B) being not lower than the above lower limit, the low dielectric properties and low water absorption of the resulting cured product tend to further improve. The molecular weight of the compound (A) represented by Formula (M1) is preferably 10000 or less, more preferably 9000 or less, even more preferably 7000 or less, still more preferably 5000 or less, and yet more preferably 4000 or less. With the molecular weight being not greater than the above upper limit, the thermal resistance and handling properties of the resulting cured product tend to further improve.

In addition, the cured product of the compound (A) represented by Formula (M1) used in the present embodiments preferably has excellent low dielectric properties. For example, the cured product of the compound (A) represented by Formula (M1) used in the present embodiments has a relative dielectric constant (Dk) measured at 10 GHz according to a cavity resonance perturbation method of preferably 3.00 or lower, more preferably 2.80 or lower, and even more preferably 2.60 or lower. Furthermore, the lower limit of the relative dielectric constant is, for example, practically 2.00 or greater. For example, the cured product of the compound (A) represented by Formula (M1) used in the present embodiments has a dielectric loss tangent (Df) measured at 10 GHz according to a cavity resonance perturbation method of preferably 0.0100 or lower, more preferably 0.0070 or lower, even more preferably 0.0060 or lower, and still more preferably 0.0050 or lower. Furthermore, the lower limit of the dielectric loss tangent is, for example, practically 0.0001 or greater, and the required performance can be satisfied even when the lower limit is higher than 0.0030.

The relative dielectric constant (Dk) and the dielectric loss tangent (Df) are measured according to methods which will be described in Examples below.

For the compound (A) represented by Formula (M1) used in the present embodiments, for example, X9-450, X9-470, or NE-X-9470S available from DIC Corporation can be used.

In the resin composition according to the present embodiments, a content of the compound (A) represented by Formula (M1) above is preferably from 1 to 90 parts by mass when a resin solid content in the resin composition is defined as 100 parts by mass. The lower limit of the content of the compound (A) represented by Formula (M1) is, when a resin solid content in the resin composition is defined as 100 parts by mass, preferably 5 part by mass or greater, and more preferably 10 parts by mass or greater, and may be 20 parts by mass or greater. With the content of the compound (A) being not lower than the above lower limit, the thermal resistance and metal foil peel strength of the resulting cured product tend to further improve. In addition, the upper limit of the content of the compound (A) represented by Formula (M1) is preferably 80 parts by mass or less, more preferably 70 parts by mass or less, even more preferably 55 parts by mass or less, still more preferably 40 parts by mass or less, and may be 35 parts by mass or less when the resin solid content in the resin composition is defined as 100 parts by mass. With the content of the compound (A) being not higher than the above upper limit, the water absorption of the resulting cured product tends to further improve.

The resin composition according to the present embodiments may contain only one compound (A) represented by Formula (M1) or may contain two or more compounds (A). When two or more types are contained, the total amount thereof is preferably in the above range.

Polymer (B) Having Structural Unit Represented by Formula (V)

The resin composition of the present embodiments contains a polymer (B) having a structural unit represented by Formula (V). With the resin composition containing the polymer (B) having the structural unit represented by Formula (V), excellent low dielectric properties can be exhibited. Further, when the polymer (B) is used in combination with the compound (A) represented by Formula (M1), the metal foil peel strength can be increased;

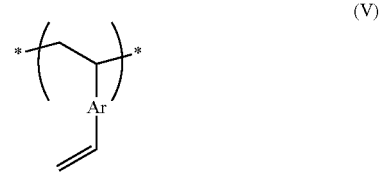

(V)

where in Formula (V), Ar represents an aromatic hydrocarbon linking group; and * represents a bond position.

The aromatic hydrocarbon linking group may be a group including only an aromatic hydrocarbon that may have a substituent, or a group inducing a combination of an aromatic hydrocarbon that may have a substituent and any other linking group, and is preferably a group including only an aromatic hydrocarbon that may have a substituent. Examples of the substituent which may be possessed by the aromatic hydrocarbon include a substituent Z (examples include an alkyl group having from 1 to 6 carbon atom(s), an alkenyl group having from 2 to 6 carbon atoms, an alkynyl group having from 2 to 6 carbon atoms, an alkoxy group having from 1 to 6 carbon atom(s), a hydroxy group, an amino group, a carboxy group, and a halogen atom). In addition, the aromatic hydrocarbon preferably has no substituent.

The aromatic hydrocarbon linking group is typically a divalent linking group.

Examples of the aromatic hydrocarbon linking group specifically include a phenylene group, a naphthalenediyl group, an anthracenediyl group, a phenanthrenediyl group, a biphenyldiyl group, and a fluorenediyl group, all of which may have a substituent. Among these, a phenylene group that may have a substituent is preferred. The substituent is exemplified by the substituent Z described above, while the group, such as a phenylene group, described above preferably has no substituent.

The structural unit represented by Formula (V) more preferably contains at least one of a structural unit represented by Formula (V1) below, a structural unit represented by Formula (V2) below, and a structural unit represented by Formula (V3) below. In Formulas below, * represents a bond position. Hereinafter, structural units represented by Formulas (V1) to (V3) may be collectively referred to as "structural unit (a)".

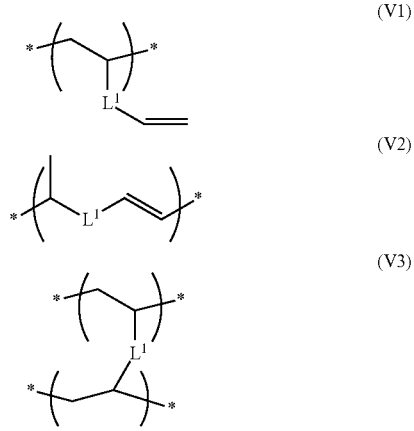

In Formulas (V1) to (V3), $L^1$ is an aromatic hydrocarbon linking group (having preferably from 6 to 22, more preferably from 6 to 18, and even more preferably from 6 to 10 carbon atoms). Specifically, examples of the aromatic hydrocarbon linking group include a phenylene group, a naphthalenediyl group, an anthracenediyl group, a phenanthrenediyl group, a biphenyldiyl group, and a fluorenediyl group, all of which may have a substituent. Among these, a phenylene group that may have a substituent is preferred. The substituent is exemplified by the substituent Z described above, while the group, such as a phenylene group, described above preferably has no substituent.

The compound forming the structural unit (a) is preferably a divinyl aromatic compound, and examples thereof include divinylbenzenes, bis(vinyloxy) benzenes, bis(1-methylvinyl) benzenes, divinylnaphthalenes, divinylanthracenes, divinylbiphenyls, and divinylphenanthrenes. Among these, a divinylbenzene is particularly preferred. One of these divinyl aromatic compounds may be used, or, according to need, two or more thereof may be used.

The polymer (B) having the structural unit represented by Formula (V) may be a homopolymer of the structural unit (a) but may be a copolymer thereof with a structural unit derived from an additional monomer.

Examples of the structural unit derived from an additional monomer include a structural unit (b) derived from an aromatic compound having one vinyl group (monovinyl aromatic compound).

When the polymer (B) having the structural unit represented by Formula (V) is a copolymer, a copolymerization ratio of the structural unit (a) is preferably 5 mol % or greater, more preferably 10 mol % or greater, and even more preferably 15 mol % or greater. The upper limit is practically 90 mol % or less.

When the polymer (B) having the structural unit represented by Formula (V) is a copolymer containing a structural unit (b) derived from a monovinyl aromatic compound, examples of the monovinyl aromatic compound include vinyl aromatic compounds, such as styrene, vinylnaphthalene, and vinylbiphenyl; and nucleus alkyl-substituted vinyl aromatic compounds, such as o-methylstyrene, m-methylstyrene, p-methylstyrene, o, p-dimethylstyrene, o-ethylvinylbenzene, m-ethylvinylbenzene, p-ethylvinylbenzene, methylvinylbiphenyl, and ethylvinylbiphenyl. The monovinyl aromatic compound exemplified here may have the substituent Z described above as appropriate. In addition, one, or two or more of these monovinyl aromatic compounds may be used.

The structural unit (b) derived from the monovinyl aromatic compound is preferably a structural unit represented by Formula (V4) below.

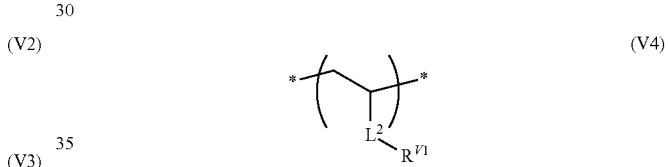

In Formula (V4), $L^2$ is an aromatic hydrocarbon linking group, and specific preferred examples include the above examples for $L^1$.

$R^{V1}$ is a hydrogen atom or a hydrocarbon group (preferably an alkyl group) having from 1 to 12 carbon atoms. $R^{V1}$, when is a hydrocarbon group, has preferably from 1 to 6 and more preferably from 1 to 3 carbon atoms. $R^{V1}$ and $L^2$ may have the substituent Z described above.

When the polymer (B) having the structural unit represented by Formula (V) is a copolymer containing the structural unit (b), a copolymerization ratio of the structural unit (b) is preferably 10 mol % or greater and more preferably 15 mol % or greater. The upper limit is preferably 98 mol % or less, more preferably 90 mol % or less, and even more preferably 85 mol % or less.

The polymer (B) having the structural unit represented by Formula (V) may have an additional structural unit other than the structural unit (a) and the structural unit (b). Examples of the additional structural unit include a structural unit (c) derived from a cycloolefin compound. Examples of the cycloolefin compound include hydrocarbons having a double bond in the ring structure. Specifically, examples include monocyclic olefins, such as cyclobutene, cyclopentene, cyclohexene, and cyclooctene; additionally, compounds having a norbornene ring structure, such as norbornene and dicyclopentadiene; and cycloolefin compounds in which an aromatic ring is fused, such as indene and acenaphthylene. Examples of the norbornene compounds include those described in paragraphs to of JP 2018-39995 A, the contents of which are incorporated herein by reference. The cycloolefin compounds exemplified here may further include the substituent Z described above.

When the polymer (B) having the structural unit represented by Formula (V) is a copolymer containing the structural unit (c), a copolymerization ratio of the structural unit (c) is preferably 10 mol % or greater, more preferably 20 mol % or greater, and even more preferably 30 mol % or greater. The upper limit is preferably 90 mol % or less, more preferably 80 mol % or less, even more preferably 70 mol % or less, and may be 50 mol % or less or 30 mol % or less.

The polymer (B) having the structural unit represented by Formula (V) may further include a structural unit (d) derived from a different polymerizable compound (hereinafter, also referred to as an additional polymerizable compound). Examples of the additional polymerizable compound (monomer) include compounds containing three vinyl groups. Specifically, examples include 1,3,5-trivinylbenzene, 1,3,5-trivinylnaphthalene, and 1,2,4-trivinylcyclohexane; alternatively, ethylene glycol diacrylate and butadiene. The copolymerization ratio of the structural unit (d) derived from the additional polymerizable compound is preferably 30 mol % or less, more preferably 20 mol % or less, and even more preferably 10 mol % or less.

An embodiment of the polymer (B) having the structural unit represented by Formula (V) is exemplified by a polymer containing the structural unit (a) as an essential unit and at least one of the structural units (b) to (d). Furthermore, an aspect in which the total of the structural units (a) to (d) accounts for 95 mol % or higher or even 98 mol % or higher of all the structural units is exemplified.

Another embodiment of the polymer (B) having the structural unit represented by Formula (V) is a polymer containing the structural unit (a) as an essential unit, in which a structural unit containing an aromatic ring accounts for preferably 90 mol % or greater, and more preferably 95 mol % or greater, or may account for 100 mol %, of all the structural units excluding the terminal.

In calculating the mol % relative to all the structural units, one structural unit is defined as a unit derived from one molecule of monomers constituting the polymer (B) having the structural unit represented by Formula (V).

A method of manufacturing the polymer (B) having the structural unit represented by Formula (V) is not particularly limited and may be carried out according to a common method, but examples thereof include polymerizing a monomer containing the divinyl aromatic compound (in the coexistence of a monovinyl aromatic compound, a cycloolefin compound, or the like as necessary) in the presence of a Lewis acid catalyst. A metal fluoride such as boron trifluoride or its complex can be used as the Lewis acid catalyst.

The structure of the chain end of the polymer (B) having the structural unit represented by Formula (V) is not particularly limited, but for the group derived from the divinyl aromatic compound, examples of the chain end structure include a structure of Formula (E1) below. In Formula (E1), $L^1$ is the same as that defined for Formula (V1) above, and * represents a bond position.

$$*\text{—CH}=\text{CH-}L^1\text{-CH}=\text{CH}_2 \quad (E1)$$

When the group derived from the monovinyl aromatic compound is at a chain end, examples of the chain end structure include a structure of Formula (E2) below, In the formula, $L^2$ and $R^{V1}$ each have the same meaning as that defined for Formula (V4) above, and * represents a bond position.

$$*\text{—CH}=\text{CH-}L^2\text{-}R^{V1} \quad (E2)$$

The molecular weight of the polymer (B) having the structural unit represented by Formula (V) in terms of number average molecular weight Mn is preferably 300 or greater, more preferably 500 or greater, even more preferably 1000 or greater, and still even more preferably 1500 or greater. The upper limit is preferably 130000 or less, more preferably 120000 or less, even more preferably 110000 or less, and still more preferably 100000 or less.

The molecular weight of the polymer (B) having the structural unit represented by Formula (V) in terms of weight average molecular weight Mw is preferably 1000 or greater, more preferably 1500 or greater, even more preferably 2000 or greater, still more preferably 2500 or greater, and yet still more preferably 3000 or greater, and may be 3500 or greater or 4000 or greater. With the molecular weight being not lower than the above lower limit, a cured product of the resin composition could effectively exhibit the excellent low dielectric properties, particularly the Df and the dielectric properties after moisture absorption, which are originally possessed by the polymer (B) having the structural unit represented by Formula (V). The upper limit is preferably 160000 or less, more preferably 150000 or less, even more preferably 140000 or less, and still more preferably 130000 or less, and may be 120000 or less or 110000 or less. With the molecular weight being not higher than the above upper limit, when the prepreg or the resin sheet is laminated on a circuit-forming substrate, an embedding defect tends to hardly occur.

The monodispersity represented by the ratio of weight average molecular weight Mw to number average molecular weight Mn (Mw/Mn) is preferably 100 or less, more preferably 50 or less, and even more preferably 20 or less. The lower limit is practically 1.1 or greater, may be 5 or greater or 7 or greater, and, even when it is 10 or greater, the required performance is satisfied.

The above Mw and Mn are measured according to the description of Examples below.

When the resin composition of the present embodiments contains two or more polymers (B) having the structural unit represented by Formula (V), the Mw, Mn, and Mw/Mn of the mixture preferably satisfy the ranges described above.

An equivalent of the vinyl group of the polymer (B) having the structural unit represented by Formula (V) is preferably 200 g/eq. or greater, more preferably 230 g/eq. or greater, and even more preferably 250 g/eq. or greater, and may be 300 g/eq. or greater, or 350 g/eq. or greater. The equivalent of the vinyl groups is preferably 1200 g/eq. or less, and more preferably 1000 g/eq. or less, and, further, may be 800 g/eq. or less, 600 g/eq. or less, 500 g/eq. or less, 400 g/eq. or less, or 350 g/eq. or less. With the equivalent being not lower than the above lower limit, the storage stability of the resin composition tends to improve, and the fluidity of the resin composition tends to improve. Therefore, there is a tendency that moldability is improved, that voids are less likely to occur at the time of forming a prepreg or the like, and that a printed wiring board having higher reliability is obtained. On the other hand, due to the equivalent being not higher than the above upper limit, the thermal resistance of the resulting cured product tends to improve.

In addition, a cured product of the polymer (B) having the structural unit represented by Formula (V) used in the present embodiments preferably has excellent low dielectric properties. For example, the cured product of the polymer (B) having the structural unit represented by Formula (V) used in the present embodiments has a relative dielectric constant (Dk) measured at 10 GHz according to a cavity resonance perturbation method of preferably 2.80 or lower, more preferably 2.60 or lower, even more preferably 2.50 or lower, and still more preferably 2.40 or lower. Furthermore, the lower limit of the relative dielectric constant is, for example, practically 1.80 or higher. Further, the cured product of the polymer (B) having the structural unit represented by Formula (V) used in the present embodiments has a dielectric loss tangent (Df) measured at 10 GHz according to a cavity resonance perturbation method of preferably 0.0030 or lower, more preferably 0.0020 or lower, and even more preferably 0.0010 or lower. Furthermore, the lower limit of the dielectric loss tangent is, for example, practically 0.0001 or higher.

The relative dielectric constant (Dk) and the dielectric loss tangent (Df) are measured according to methods which will be described in Examples below.

For the polymer (B) having the structural unit represented by Formula (V) in the present specification, reference can be made to compounds, their synthesis conditions, and the like described in paragraphs [0029] to [0058] of WO 2017/115813, compounds, their synthesis conditions, and the like described in paragraphs [0013] to [0058] of JP 2018-039995 A, compounds, their synthesis conditions, and the like described in paragraphs [0008] to [0043] of JP 2018-168347 A, compounds, their synthesis conditions, and the like described in paragraphs [0014] to [0042] of JP 2006-070136A, compounds, their synthesis conditions, and the like described in paragraphs [0014] to [0061] of JP 2006-089683 A, and compounds, their synthesis conditions, and the like described in paragraphs [0008] to [0036] of JP 2008-248001 A, the contents of which are incorporated herein by reference.

In the resin composition of the present embodiments, a content of the polymer (B) having the structural unit represented by Formula (V) is from 1 to 90 parts by mass when a resin solid content in the resin composition is defined as 100 parts by mass. The lower limit of the content of the polymer (B) having the structural unit represented by Formula (V) is preferably 5 parts by mass or greater, more preferably 10 parts by mass or greater, even more preferably 15 parts by mass or greater, and still more preferably 20 parts by mass or greater, and may be 30 parts by mass or greater when the resin solid content in the resin composition is defined as 100 parts by mass. With the content of the polymer (B) having the structural unit represented by Formula (V) being not lower than the above lower limit, low dielectric properties, particularly a low dielectric constant, can be effectively achieved. On the other hand, the upper limit of the content of the polymer (B) having the structural unit represented by Formula (V) is preferably 80 parts by mass or less, more preferably 70 parts by mass or less, even more preferably 50 parts by mass or less, and still more preferably 40 parts by mass or less, and may be 35 parts by mass or less when the resin solid content in the resin composition is defined as 100 parts by mass. When the content is not higher than the above upper limit, the metal foil peel strength of the resulting cured product can be effectively increased.

Only one, or two or more of the polymers (B) having the structural unit represented by Formula (V) may be contained in the resin composition. When two or more of the polyfunctional vinyl aromatic polymers (A) are contained, the total amount is preferably in the above range.

In the resin composition of the present embodiments, a total amount of the compound (A) represented by Formula (M1) and the polymer (B) having the structural unit represented by Formula (V) is preferably 20 mass % or greater, more preferably 30 mass % or greater, and even more preferably 40 mass % or greater of the resin solid content. With the total amount being not lower than the above lower limit, the thermal resistance, low dielectric properties, and metal foil peel strength of the resulting cured product tend to further improve. In addition, the upper limit of the total amount may be 90 mass % or less, 70 mass % or less, or 50 mass % or less of the resin solid content in the resin composition in consideration of the properties (for example, heat resistance and low water absorption) other than the low dielectric properties and metal foil peel strength of the obtained cured product.

In the resin composition according to the present embodiments, a mass ratio of the compound (A) represented by Formula (M1) and the compound (B) to the polymer (B) having the structural unit represented by Formula (V) is preferably from 9:1 to 1:9, more preferably from 8:2 to 2:8, even more preferably from 7:3 to 3:7, and still more preferably from 6:4 to 4:6. With such a blend ratio, both properties of the metal foil peel strength and the low dielectric properties can be improved in a well-balanced manner.

<Additional Resin Component (C)>

The resin composition according to the present embodiments may further contain at least one additional resin component (C) selected from the group consisting of: a maleimide compound other than the compound (A) represented by Formula (M1); an epoxy compound; a phenolic compound; an oxetane resin; a benzoxazine compound; a polyphenylene ether compound containing two or more unsaturated carbon-carbon double bonds; and a cyanate ester compound, and preferably contains at least one additional resin component selected from the group consisting of: a maleimide compound other than the compound (A) represented by Formula (M1); an epoxy compound; a phenolic compound; a polyphenylene ether compound containing two or more unsaturated carbon-carbon double bonds; and a cyanate ester compound. The resin composition containing such a component can more effectively achieve other desired performance required for a printed wiring board. Particularly, the resin composition according to the present embodiments preferably contains a maleimide compound and/or a polyphenylene ether compound containing two or more unsaturated carbon-carbon double bonds, and more preferably contains a polyphenylene ether compound containing two or more unsaturated carbon-carbon double bonds.

The resin composition according to the present embodiments also preferably contains a cyanate ester compound.

Preferably, cured products of the additional resin components (C) each have excellent low dielectric properties. For example, the cured products of the additional resin components (C) should each have a relative dielectric constant (Dk) measured at 10 GHz according to a cavity resonance perturbation method of preferably 4.0 or lower and more preferably 3.5 or lower. In addition, the lower limit of the relative dielectric constant (Dk) is, for example, practically 2.0 or higher. Further, the cured products of the additional resin components (C) should each have a dielectric loss tangent (Df) measured at 10 GHz according to a cavity resonance perturbation method of preferably 0.030 or lower and more preferably 0.002 or lower. In addition, the lower limit of the dielectric loss tangent (Df) is, for example, practically 0.0001 or higher.

Furthermore, the cured products of the additional resin components (C) preferably have high thermal resistance. For example, the cured products of the additional resin components (C) each have a glass transition temperature measured in accordance with the dynamic viscoelasticity measurement defined in JIS C 6481 of preferably 150° C. or higher, more preferably 180° C. or higher, and even more preferably 200° C. or higher. With the glass transition temperature being not lower than the above lower limit, a cured product with even better thermal resistance is obtained. In addition, the upper limit of the glass transition temperature is practically 400° C. or lower.

In Formula (2M), $R^{54}$ each independently represents a hydrogen atom or a methyl group; and $n_4$ represents an integer of 1 or more. $n_4$ is preferably an integer from 1 to 10, more preferably an integer from 1 to 5, even more preferably an integer from 1 to 3, and still more preferably 1 or 2. The compound (2M) represented by Formula (2M) may include only one, or two or more compounds differing in the value of at least $n_4$.

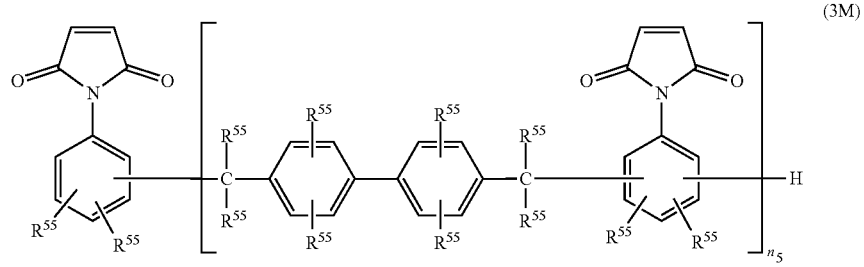

(3M)

Furthermore, the resin composition according to the present embodiments may contain an elastomer. Still more, the resin composition according to the present embodiments may contain an active ester compound. In addition, the resin composition may contain an additive commonly used in the technical field of the present invention without departing from the spirit of the present invention.

Hereinafter, details of the additional resin component (C) as well as the elastomer and active ester will be described.

<<Maleimide Compound Other than Compound (A) Represented by Formula (M1)>>

The resin composition according to the present embodiments may contain a maleimide compound (which may be hereinafter referred to simply as the "additional maleimide compound") other than the compound (A) represented by Formula (M1).

The additional maleimide compound is any compound having one or more (preferably from 2 to 12, more preferably from 2 to 6, even more preferably from 2 to 4, still more preferably 2 or 3, and yet more preferably 2) maleimide groups per molecule and is not particularly limited, and a compound from a wide variety of compounds commonly used in the field of printed wiring boards can be used.

Examples of the additional maleimide compound includes compounds represented by Formulas (2M) to (5M), further compounds represented by Formulas (2M) to (4M). Using such an additional maleimide compound in a printed wiring board material (e.g., such as a laminate or a metal-foil clad laminate) or the like can impart excellent thermal resistance to the material.

In Formula (3M), $R^{55}$ each independently represents a hydrogen atom, an alkyl group having from 1 to 8 carbon atom(s), or a phenyl group; and $n_5$ represents an integer of 1 or more and 10 or less.

$R^{55}$ is preferably a hydrogen atom, a methyl group, an ethyl group, a n-propyl group, an isopropyl group, a n-butyl group, an isobutyl group, a t-butyl group, a n-pentyl group, or a phenyl group, more preferably one of a hydrogen atom and a methyl group, and even more preferably a hydrogen atom.

$n_5$ is preferably an integer from 1 to 5, more preferably an integer from 1 to 3, and even more preferably 1 or 2.

The compound (3M) represented by Formula (3M) may include only one, or two or more compounds differing in the value of at least $n_5$.

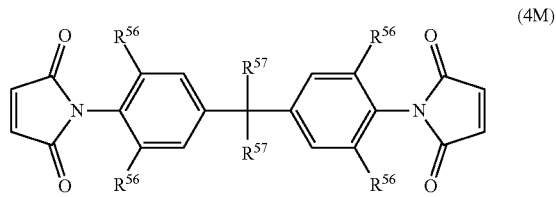

(4M)

In Formula (4M), $R^{56}$ each independently represents a hydrogen atom, a methyl group, or an ethyl group; and each $R^{57}$ independently represents a hydrogen atom or a methyl group.

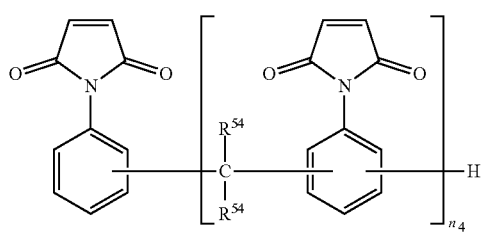

(2M)

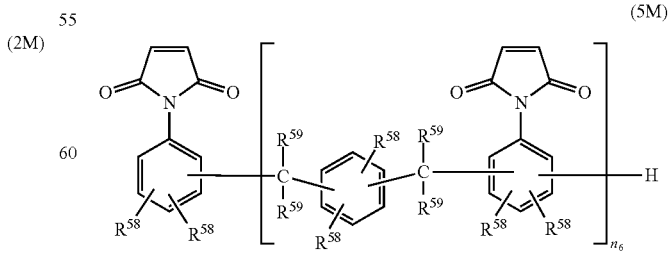

(5M)

where in Formula (5M), each $R^{58}$ each independently represents a hydrogen atom, an alkyl group having 1 to 8 carbon atom(s), or a phenyl group; each $R^{59}$ each independently represents a hydrogen atom or a methyl group; and no represents an integer of 1 or more.

$R^{58}$ is preferably a hydrogen atom, a methyl group, an ethyl group, a n-propyl group, an isopropyl group, a n-butyl group, an isobutyl group, a t-butyl group, a n-pentyl group, or a phenyl group, more preferably one of a hydrogen atom and a methyl group, and even more preferably a hydrogen atom.

$R^{59}$ is preferably a methyl group.

$n_6$ is preferably an integer of from 1 to 10, more preferably an integer of from 1 to 5, even more preferably an integer of from 1 to 3, and still more preferably 1 or 2, and may be 1.

The compound represented by Formula (5M) may be a mixture of compounds differing in ng, and is preferably a mixture.

Among the compounds represented by Formulas (2M) to (5M) above, further the compounds represented by Formulas (2M) to (4M), the additional maleimide compound is more preferably a compound represented by Formula (3M).

The additional maleimide compound may be prepared by a known method, or a commercially available product may be used. For the commercially available product, examples of the compound represented by Formula (3M) include "MIR-3000-70MT" available from Nippon Kayaku Co., Ltd., examples of the compound represented by Formula (2M) include "BMI-2300" available from Daiwa Kasei Industry Co., Ltd., examples of the compound represented by Formula (4M) include "BMI-70" available from K—I Chemical Industry Co., Ltd., and examples of the compound represented by Formula (5M) include "MIR-5000" available from Nippon Kayaku Co., Ltd.

In addition, examples of the additional maleimide compound other than those described above include oligomers of phenylmethane maleimide, m-phenylene bismaleimide, 2,2-bis(4-(4-maleimidophenoxy)-phenyl) propane, 4-methyl-1,3-phenylene bismaleimide, 1,6-bismaleimide-(2,2,4-trimethyl) hexane, 4,4'-diphenylether bismaleimide, 4,4'-diphenylsulfone bismaleimide, 1,3-bis(3-maleimidophenoxy) benzene, 1,3-bis(4-maleimidophenoxy) benzene, and prepolymers of these, and prepolymers of a maleimide of these and an amine.

When the resin composition according to the present embodiments contains the additional maleimide compound, the lower limit of the content of the additional maleimide compound is preferably 1 part by mass or greater, and more preferably 5 parts by mass or greater, and may be 10 parts by mass or greater relative to 100 parts by mass of the resin solid content in the resin composition. With the content of the additional maleimide compound being 1 part by mass or more, flame resistance of the resulting cured product tends to improve. The upper limit of the content of the additional maleimide compound is, relative to 100 parts by mass of the resin solid content in the resin composition, preferably 70 parts by mass or less, more preferably 50 parts by mass or less, even more preferably 30 parts by mass or less, and still more preferably 20 parts by mass or less. With the content of the additional maleimide compound being 70 parts by mass or less, the metal foil peel strength and low water absorption tend to improve.

The resin composition in the present embodiments may contain only one additional maleimide compound or may contain two or more additional maleimide compounds. When two or more types are contained, the total amount thereof is preferably in the above range.

In addition, the resin composition in the present embodiments can also be configured to contain substantially no additional maleimide compound. "To contain substantially no" means that the content of the additional maleimide compound is less than 1 part by mass relative to 100 parts by mass of the resin solid content in the resin composition.

<<Epoxy Compound>>

The resin composition according to the present embodiments may contain an epoxy compound.

The epoxy compound is any compound or resin having one or more (preferably from 2 to 12, more preferably from 2 to 6, even more preferably from 2 to 4, still more preferably 2 or 3, and yet more preferably 2) epoxy groups per molecule and is not particularly limited, and a compound from a wide variety of compounds commonly used in the field of printed wiring boards can be used.

Examples of the epoxy compound include compounds obtained by epoxidation of a double bond, such as bisphenol A-type epoxy resins, bisphenol E-type epoxy resins, bisphenol F-type epoxy resins, bisphenol S-type epoxy resins, phenol novolac-type epoxy resins, bisphenol A novolac-type epoxy resins, glycidyl ester-type epoxy resins, aralkyl novolac-type epoxy resins, biphenyl aralkyl-type epoxy resins, naphthylene ether-type epoxy resins, cresol novolac-type epoxy resins, multifunctional phenol-type epoxy resins, naphthalene-type epoxy resins, anthracene-type epoxy resins, naphthalene skeleton-modified novolac-type epoxy resins, phenol aralkyl-type epoxy resins, naphthol aralkyl-type epoxy resins, dicyclopentadiene-type epoxy resins, biphenyl-type epoxy resins, alicyclic epoxy resins, polyol-type epoxy resins, phosphorus-containing epoxy resins, glycidyl amine, glycidyl ester, and butadiene; and compounds obtained by reaction of a hydroxyl group-containing silicone resin with epichlorohydrin. Using such a compound improves the moldability and adhesion of the resin composition. Among these, from the viewpoints of further improving the flame retardancy and thermal resistance, the epoxy compound is preferably a biphenyl aralkyl-type epoxy resin, a naphthylene ether-type epoxy resin, a multifunctional phenol-type epoxy resin, or a naphthalene-type epoxy resin, and more preferably a biphenyl aralkyl-type epoxy resin.

The resin composition according to the present embodiments preferably contains the epoxy resin within a range that does not impair the effects of the present invention. When the resin composition according to the present embodiments contains the epoxy compound, the content of the epoxy compound is preferably 0.1 parts by mass or more, more preferably 1 part by mass or more, and even more preferably 2 parts by mass or more relative to 100 parts by mass of the resin solid content in the resin composition. With the content of the epoxy resin being 0.1 parts by mass or more, the metal foil peel strength and toughness tend to improve. When the resin composition according to the present embodiments contains the epoxy resin, the upper limit of the content of the epoxy resin is preferably 50 parts by mass or less, more preferably 30 parts by mass or less, even more preferably 20 parts by mass or less, still more preferably 10 parts by mass, yet more preferably 8 parts by mass or less, and still even more preferably 5 parts by mass or less relative to 100 parts by mass of the resin solid content in the resin composition. With the content of the epoxy resin being 50 parts by mass or less, electrical properties of the resulting cured product tend to improve.

The resin composition in the present embodiments may contain only one epoxy compound or may contain two or more epoxy compounds. When two or more types are contained, the total amount thereof is preferably in the above range.

<<Phenolic Compound>>

The resin composition according to the present embodiments may contain a phenolic compound.

The phenolic compound is any phenolic compound having one or more (preferably from 2 to 12, more preferably from 2 to 6, even more preferably from 2 to 4, still more preferably 2 or 3, and yet more preferably 2) phenolic hydroxyl groups per molecule and is not particularly limited, and a compound from a wide variety of compounds commonly used in the field of printed wiring boards can be used.

Examples of the phenolic compound include bisphenol A-type phenolic resins, bisphenol E-type phenolic resins, bisphenol F-type phenolic resins, bisphenol S-type phenolic resins, phenol novolac resins, bisphenol A novolac-type phenolic resins, glycidyl ester-type phenolic resins, aralkyl novolac phenolic resins, biphenyl aralkyl-type phenolic resins, cresol novolac-type phenolic resins, multifunctional phenolic resins, naphthol resins, naphthol novolac resins, multifunctional naphthol resins, anthracene-type phenolic resins, naphthalene skeleton-modified novolac-type phenolic resins, phenol aralkyl-type phenolic resins, naphthol aralkyl-type phenolic resins, dicyclopentadiene-type phenolic resins, biphenyl-type phenolic resins, alicyclic phenolic resins, polyol-type phenolic resins, phosphorus-containing phenolic resins, and hydroxyl group-containing silicone resins. Among these, from the viewpoint of further improving the flame resistance of the resulting cured product, the phenolic compound is preferably at least one selected from the group consisting of biphenyl aralkyl-type phenolic resins, naphthol aralkyl-type phenolic resins, phosphorus-containing phenolic resins, and hydroxyl group-containing silicone resins.

The resin composition according to the present embodiments preferably contains the phenolic compound within a range that does not impair the effects of the present invention. When the resin composition according to the present embodiments contains the phenolic compound, the content of the phenolic compound is preferably 0.1 parts by mass or more and preferably 50 parts by mass or less relative to 100 parts by mass of the resin solid content in the resin composition.

The resin composition in the present embodiments may contain only one phenolic compound or may contain two or more phenolic compounds. When two or more types are contained, the total amount thereof is preferably in the above range.

In addition, the resin composition in the present embodiments can also be configured to contain substantially no phenolic compound. "To contain substantially no" means that the content of the phenolic compound is less than 0.1 parts by mass relative to 100 parts by mass of the resin solid content in the resin composition.

<<Oxetane Resin>>

The resin composition according to the present embodiments may contain an oxetane resin.

The oxetane resin is any compound having one or more (preferably from 2 to 12, more preferably from 2 to 6, even more preferably from 2 to 4, still more preferably 2 or 3, and yet more preferably 2) oxetanyl groups and is not particularly limited, and a compound from a wide variety of compounds commonly used in the field of printed wiring boards can be used.

Examples of the oxetane resin include oxetane, alkyl oxetanes (e.g., such as 2-methyloxetane, 2,2-dimethyloxetane, 3-methyloxetane, and 3,3-dimethyloxatane), 3-methyl-3-methoxymethyloxetane, 3,3-di(trifluoromethyl) oxetane, 2-chloromethyloxetane, 3,3-bis(chloromethyl) oxetane, biphenyl-type oxetane, OXT-101 (available from Toagosei Co., Ltd.), and OXT-121 (available from Toagosei Co., Ltd.).

The resin composition according to the present embodiments preferably contains the oxetane resin within a range that does not impair the effects of the present invention. When the resin composition according to the present embodiments contains the oxetane resin, the content of the oxetane resin is preferably 0.1 parts by mass or more, more preferably 1 part by mass or more, and even more preferably 2 parts by mass or more relative to 100 parts by mass of the resin solid content in the resin composition. With the content of the oxetane resin being 0.1 parts by mass or more, the metal foil peel strength and toughness tend to improve. When the resin composition according to the present embodiments contains the oxetane resin, the upper limit of the content of the oxetane resin is preferably 50 parts by mass or less, more preferably 30 parts by mass or less, even more preferably 20 parts by mass or less, still more preferably 10 parts by mass or less, and yet more preferably 8 parts by mass or less relative to 100 parts by mass of the resin solid content in the resin composition. With the content of the oxetane resin being 50 parts by mass or less, the electrical properties of the resulting cured product tend to improve.

The resin composition in the present embodiments may contain only one oxetane resin or may contain two or more oxetane resins. When two or more types are contained, the total amount thereof is preferably in the above range.

In addition, the resin composition in the present embodiments can also be configured to contain substantially no oxetane resin. "To contain substantially no" means that the content of the oxetane resin is less than 0.1 parts by mass relative to 100 parts by mass of the resin solid content in the resin composition.

<<Benzoxazine Compound>>

The resin composition according to the present embodiments may contain a benzoxazine compound.

The benzoxazine compound is any compound having two or more (preferably from 2 to 12, more preferably from 2 to 6, even more preferably from 2 to 4, still more preferably 2 or 3, and yet more preferably 2) dihydrobenzoxazine rings per molecule and is not particularly limited, and a compound from a wide variety of compounds commonly used in the field of printed wiring boards can be used.

Examples of the benzoxazine compound include a bisphenol A-type benzoxazine BA-BXZ (available from Konishi Chemical Ind. Co., Ltd.), a bisphenol F-type benzoxazine BF—BXZ (available from Konishi Chemical Industry Co., Ltd.), and a bisphenol S-type benzoxazine BS—BXZ (available from Konishi Chemical Industry Co., Ltd.).

The resin composition of the present embodiments preferably contains the benzoxazine compound within a range that does not impair the effects of the present invention. When the resin composition of the present embodiments contains the benzoxazine compound, the content of the benzoxazine compound is preferably 0.1 parts by mass or more and preferably 50 parts by mass or less relative to 100 parts by mass of the resin solid content in the resin composition.

The resin composition in the present embodiments may contain only one benzoxazine compound or may contain two or more benzoxazine compounds. When two or more types are contained, the total amount thereof is preferably in the above range.

In addition, the resin composition in the present embodiments can also be configured to contain substantially no benzoxazine compound. "To contain substantially no" means that the content of the benzoxazine compound is less than 0.1 parts by mass relative to 100 parts by mass of the resin solid content in the resin composition.

<<Polyphenylene Ether Compound Containing Two or More Unsaturated Carbon-Carbon Double Bonds>>

The resin composition according to the present embodiments may contain a polyphenylene ether compound containing two or more unsaturated carbon-carbon double bonds.

The polyphenylene ether compound containing two or more unsaturated carbon-carbon double bonds is preferably a polyphenylene ether compound having two or more groups selected from the group consisting of (meth)acrylic groups, maleimide groups, and vinylbenzyl groups.

Hereinafter, these details will be described.

The polyphenylene ether compound containing two or more unsaturated carbon-carbon double bonds is exemplified by compounds having a phenylene ether skeleton represented by Formula (X1) below:

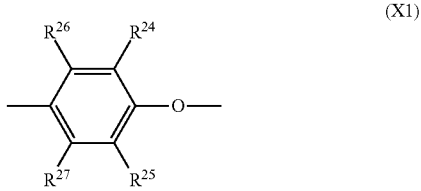

where in Formula (X1), $R^{24}$, $R^{25}$, $R^{26}$, and $R^{27}$ may be identical or different, and each represent an alkyl group having 6 or fewer carbon atoms, an aryl group, a halogen atom, or a hydrogen atom.

The polyphenylene ether compound containing two or more unsaturated carbon-carbon double bonds may further include a repeating unit represented by Formula (X2):

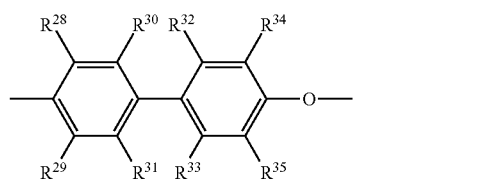

where in Formula (X2), $R^{28}$, $R^{29}$, $R^{30}$, $R^{34}$, and $R^{35}$ may be the same or different, and each represents an alkyl group having 6 or fewer carbon atoms or a phenyl group; $R^{31}$, $R^{32}$, and $R^{33}$ may be the same or different, and each represents a hydrogen atom, an alkyl group having 6 or fewer carbon atoms, or a phenyl group, and/or a repeating unit represented by Formula (X3):

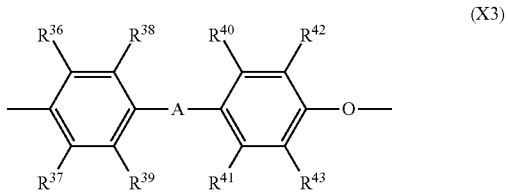

where in Formula (X3), $R^{36}$, $R^{37}$, $R^{38}$, $R^{39}$, $R^{40}$, $R^{41}$, $R^{42}$, and $R^{43}$ may be the same or different, and each represents a hydrogen atom, an alkyl group having 6 or fewer carbon atoms, or a phenyl group; and -A- is a linear, branched, or cyclic divalent hydrocarbon group having 20 or fewer carbon atoms.

The polyphenylene ether compound containing two or more unsaturated carbon-carbon double bonds is preferably a modified polyphenylene ether compound (which may be hereinafter referred to as a "modified polyphenylene ether compound (g)") in which one or some or all terminals are functionalized with an ethylenically unsaturated group and more preferably a modified polyphenylene ether compound having two or more groups selected from the group consisting of (meth)acrylic groups, maleimide groups, and vinylbenzyl groups at a terminal. Employing such a modified polyphenylene ether compound (g) can further reduce the dielectric loss tangent (Df) of the resin composition and can increase the metal foil peel strength. One of these may be used, or two or more may be used in combination.

Examples of the modified polyphenylene ether compound (g) include compounds represented by Formula (1):

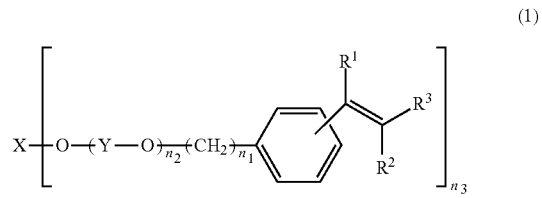

where in Formula (1), X represents an aromatic group; —(Y—O)$n_2$-represents a polyphenylene ether structure; $R^1$, $R^2$, and $R^3$ each independently represent a hydrogen atom, an alkyl group, an alkenyl group, or an alkynyl group; $n_1$ represents an integer from 1 to 6; $n_2$ represents an integer from 1 to 100; and $n_3$ represents an integer from 1 to 4.

When $n_2$ and/or $n_3$ is an integer of 2 or more, $n_2$ structural units (Y—O) and/or $n_3$ structural units may each be identical or different. $n_3$ is preferably 2 or more and more preferably 2.

The modified polyphenylene ether compound (g) in the present embodiments is preferably a compound represented by Formula (2):

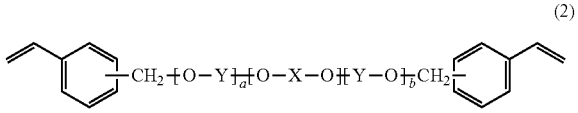

where —(O—X—O)— is preferably represented by Formula (3):

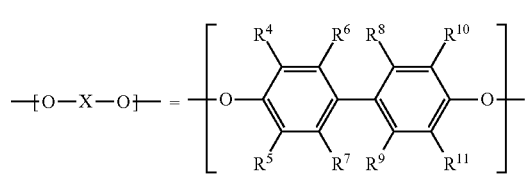
(3)

where in Formula (3), $R^4$, $R^5$, $R^6$, $R^{10}$, and $R^{11}$ may be the same or different, and each represents an alkyl group having 6 or fewer carbon atoms, or a phenyl group; and $R^7$, $R^8$, and $R^9$ may be the same or different, and each represents a hydrogen atom, an alkyl group having 6 or fewer carbon atoms, or a phenyl group;

and/or Formula (4):

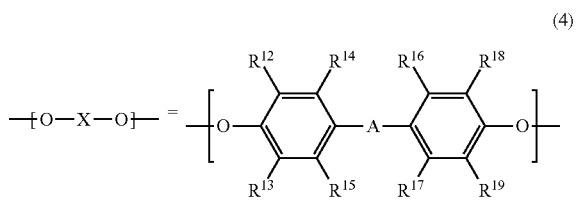
(4)

where in Formula (4), $R^{12}$, $R^{13}$, $R^{14}$, $R^{15}$, $R^{16}$, $R^{17}$, $R^{18}$, and $R^{19}$ may be the same or different, and each represents a hydrogen atom, an alkyl group having 6 or fewer carbon atoms, or a phenyl group; and -A- is a linear, branched, or cyclic divalent hydrocarbon group having 20 or fewer carbon atoms.

Moreover, —(Y—O)— is preferably represented by Formula (5):

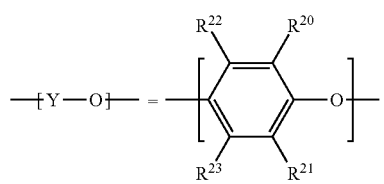
(5)

where in Formula (5), $R^{20}$ and $R^{21}$ may be the same or different, and each represents an alkyl group having 6 or fewer carbon atoms or a phenyl group; and $R^{22}$ and $R^{23}$ may be identical or different and are a hydrogen atom(s), an alkyl group(s) having 6 or fewer carbon atoms, or a phenyl group(s).

In Formula (2), a and b represent an integer from 0 to 100, where at least one of a or b is not 0; and a and b are preferably integers from 0 to 50 and more preferably integers from 1 to 30. When a and/or b is an integer of 2 or more, two or more —(Y—O)— may each independently have one type of structure that is arranged sequentially, or two or more types of structures that are arranged in blocks or randomly.

Examples of -A- in Formula (4) include, but are not limited to, divalent organic groups, such as a methylene group, an ethylidene group, a 1-methylethylidene group, a 1,1-propylidene group, a 1,4-phenylenebis(1-methylethylidene) group, a 1,3-phenylenebis(1-methylethylidene) group, a cyclohexylidene group, a phenylmethylene group, a naphthylmethylene group, and a 1-phenylethylidene group.

Among the modified polyphenylene ether compounds (g), preferred is a polyphenylene ether compound in which $R^4$, $R^5$, $R^6$, $R^{10}$, $R^{11}$, $R^{20}$, and $R^{21}$ are alkyl groups having 3 or fewer carbon atoms, and $R^7$, $R^8$, $R^9$, $R^{12}$, $R^{13}$, $R^{14}$, $R^{15}$, $R^{16}$, $R^{17}$, $R^{18}$, $R^{19}$, $R^{22}$, and $R^{23}$ are hydrogen atoms or alkyl groups having 3 or fewer carbon atoms, and in particular, —(OXO)— represented by Formula (3) or Formula (4) is preferably Formula (9), Formula (10), and/or Formula (11), and —(YO)— represented by Formula (5) is preferably Formula (12) or Formula (13). When a and/or b is an integer of 2 or more, two or more —(Y—O)— may each independently have a structure in which two or more of Formulas (12) and/or Formulas (13) are arranged sequentially, or a structure in which Formula (12) and Formula (13) are arranged in blocks or randomly.

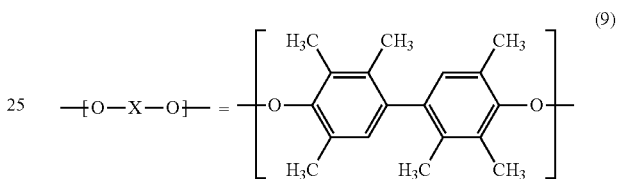
(9)

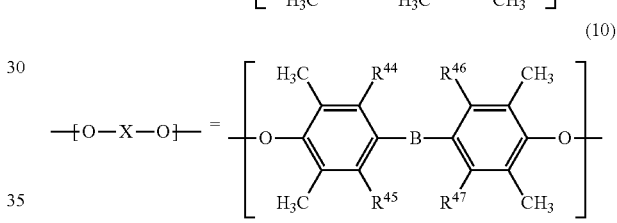
(10)

In Formula (10), $R^{44}$, $R^{45}$, $R^{46}$, and $R^{47}$ may be identical or different and are a hydrogen atom(s) or a methyl group(s); and —B— is a linear, branched, or cyclic divalent hydrocarbon group having 20 or fewer carbon atoms.

Specific examples of —B— include the same as those for the specific examples of -A- in Formula (4).

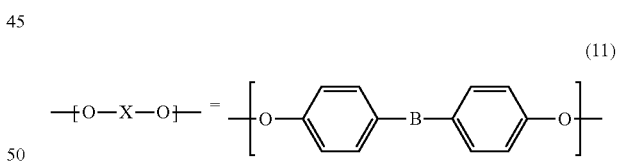
(11)

In Formula (11), —B— is a linear, branched, or cyclic divalent hydrocarbon group having 20 or fewer carbon atoms.

Specific examples of —B— include the same as those for the specific examples of -A- in Formula (4).

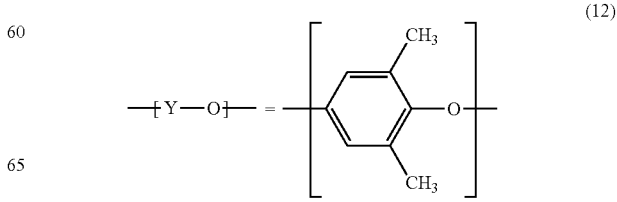
(12)

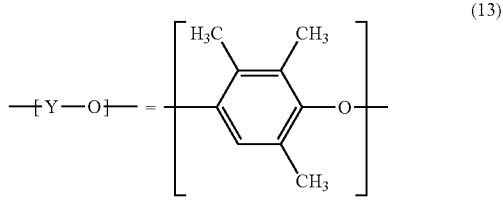

Additionally, as for details of the polyphenylene ether compound containing two or more unsaturated carbon-carbon double bonds, reference can be made to JP 2018-016709 A, the contents of which are incorporated in the present specification.

In addition to the above, the polyphenylene ether compound used in the present embodiments may be an unmodified polyphenylene ether compound terminated with a hydroxyl group. For the unmodified polyphenylene ether compound, descriptions in paragraphs to of JP 2017-119739 A can be employed, the contents of which are incorporated in the present specification.

The number average molecular weight of the polyphenylene ether compound containing two or more unsaturated carbon-carbon double bonds (preferably the modified polyphenylene ether compound (g)) in terms of polystyrene by a gel permeation chromatography (GPC) method is preferably 500 or greater and 3000 or less. With the number average molecular weight being 500 or greater, stickiness tends to be further prevented when the resin composition according to the present embodiments is formed into a coating film. With the number average molecular weight being 3000 or less, the solubility in a solvent tends to further improve.

In addition, the weight average molecular weight of the polyphenylene ether compound containing two or more unsaturated carbon-carbon double bonds (preferably the modified polyphenylene ether compound (g)) in terms of polystyrene by GPC is preferably 800 or greater and 10000 or less and more preferably 800 or greater and 5000 or less. With the weight average molecular weight being not less than the above lower limit, the relative dielectric constant (Dk) and dielectric loss tangent (Df) of the cured product of the resin composition tends to further decrease, and due to the weight average molecular weight being not higher than the above upper limit, the solubility of the resin composition in a solvent, the low viscosity properties and the moldability of the resin composition in producing a varnish or the like which will be described later tend to further improve.

Furthermore, when the polyphenylene ether compound containing two or more unsaturated carbon-carbon double bonds is the modified polyphenylene ether compound (g), the terminal unsaturated carbon-carbon double bond equivalent is preferably from 400 g to 5000 g and more preferably from 400 g to 2500 g per unsaturated carbon-carbon double bond. With the terminal unsaturated carbon-carbon double bond equivalent being not lower than the above lower limit, the relative dielectric constant (Dk) and dielectric loss tangent (Df) of the cured product of the resin composition tend to further decrease. With the terminal unsaturated carbon-carbon double bond equivalent being not higher than the above upper limit, the solubility of the resin composition in a solvent, the low viscosity properties and the moldability of the resin composition tend to further improve.

When the resin composition of the present embodiments contains a polyphenylene ether compound containing two or more unsaturated carbon-carbon double bonds, the lower limit of the content of the polyphenylene ether compound containing two or more unsaturated carbon-carbon double bonds is, relative to 100 parts by mass of the resin solid content in the resin composition, preferably 1 part by mass or greater, more preferably 3 parts by mass or greater, even more preferably 5 parts by mass or greater, and still more preferably 7 parts by mass or greater. With the content of the polyphenylene ether compound being not lower than the above lower limit, the low water absorption and lower dielectric properties (Dk and/or Df) of the resulting cured product tend to further improve. In addition, the upper limit of the content of the polyphenylene ether compound containing two or more unsaturated carbon-carbon double bonds is, relative to 100 parts by mass of the resin solid content in the resin composition, preferably 80 parts by mass or less, more preferably 70 parts by mass or less, even more preferably 60 parts by mass or less, still more preferably 50 parts by mass or less, and yet still more preferably 40 parts by mass or less, and may be 30 parts by mass or less or 25 parts by mass or less. With the content of the compound (B) being not higher than the above upper limit, the thermal resistance and chemical resistance of the resulting cured product tend to further improve.

The resin composition in the present embodiments may contain only one, or two or more of polyphenylene ether compounds containing two or more unsaturated carbon-carbon double bonds. When two or more types are contained, the total amount thereof is preferably in the above range.

<<Cyanate Ester Compound>>

The resin composition according to the present embodiments may contain a cyanate ester compound.

The cyanate ester compound is any compound containing one or more (preferably from 2 to 12, more preferably from 2 to 6, even more preferably from 2 to 4, still more preferably 2 or 3, and yet more preferably 2) cyanate groups (cyanato groups) per molecule and is not particularly limited, and a compound from a wide variety of compounds commonly used in the field of printed wiring boards can be used. In addition, the cyanate ester compound is preferably a compound in which the cyanate group is directly attached to an aromatic skeleton (aromatic ring).

Examples of the cyanate ester compound include at least one selected from the group consisting of phenol novolac-type cyanate ester compounds, naphthol aralkyl-type cyanate ester compounds (naphthol aralkyl-type cyanates), naphthylene ether-type cyanate ester compounds, biphenyl aralkyl-type cyanate ester compounds, xylene resin-type cyanate ester compounds, tris phenol methane-type cyanate ester compounds, adamantane skeleton-type cyanate ester compounds, bisphenol M-type cyanate ester compounds, bisphenol A-type cyanate ester compounds, and diallyl bisphenol A-type cyanate ester compounds. Among these, from the viewpoint of further improving the low water absorption of the resulting cured product, the cyanate ester compound is preferably at least one selected from the group consisting of phenol novolac-type cyanate ester compounds, naphthol aralkyl-type cyanate ester compounds, naphthylene ether-type cyanate ester compounds, xylene resin-type cyanate ester compounds, bisphenol M-type cyanate ester compounds, bisphenol A-type cyanate ester compounds, and diallyl bisphenol A-type cyanate ester compounds, more preferably at least one selected from the group consisting of phenol novolac-type cyanate ester compounds and naphthol aralkyl-type cyanate ester compounds, and even more preferably naphthol aralkyl-type cyanate ester compounds. The cyanate ester compound of these may be prepared by a known method, or a commercially available product may be used. A cyanate ester compound having a naphthol aralkyl skeleton, a naphthylene ether skeleton, a xylene skeleton, a trisphenol methane skeleton, or an adamantane skeleton has a relatively large number of functional group equivalents and a small number of unreacted cyanate ester groups, and thus the cured product of the resin composition formed using the cyanate ester compound of these tends to have even better low water absorption. In addition, the plating adhesion tends to further improve mainly due to having an aromatic skeleton or an adamantane skeleton.

The naphthol aralkyl-type cyanate ester compound is preferably a compound represented by Formula (1) below:

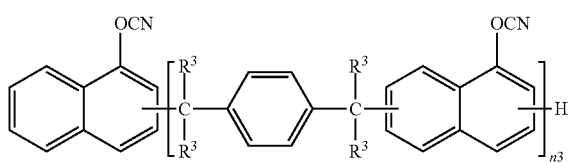

(1)

where in Formula (1), $R^3$ each independently represents a hydrogen atom or a methyl group, and $n_3$ represents an integer of 1 or more.

In Formula (1), $R^3$ each independently represents a hydrogen atom or a methyl group, and, of these, is preferably a hydrogen atom.

In Formula (1), $n_3$ is an integer of 1 or more, and preferably an integer of from 1 to 20, more preferably an integer of from 1 to 10, and even more preferably an integer of from 1 to 6.

The novolac-type cyanate ester compound is not particularly limited, but, for example, is preferably a compound represented by Formula (VII) below:

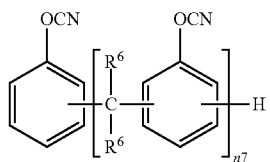

(VII)

where in Formula (VII), $R^6$ each independently represents a hydrogen atom or a methyl group; and $n_7$ represents an integer of 1 or more.

In Formula (VII), $R^6$ each independently represents a hydrogen atom or a methyl group, and, of these, is preferably a hydrogen atom.

In Formula (VII), $n_7$ is an integer of 1 or more, and preferably an integer of from 1 to 20, more preferably an integer of from 1 to 10, and even more preferably an integer of from 1 to 6.

As the bisphenol A-type cyanate ester compound, one or more selected from the group consisting of 2,2-bis(4-cyanatophenyl) propane and a prepolymer of 2,2-bis(4-cyanatophenyl) propane may be used.

The resin composition according to the present embodiments preferably contains the cyanate ester compound within a range that does not impair the effects of the present invention. When the resin composition according to the present embodiments contains the cyanate ester compound, the lower limit of the content thereof is preferably 0.1 parts by mass or greater, more preferably 1 part by mass or greater, even more preferably 2 parts by mass or greater, still more preferably 5 parts by mass or greater, and yet still more preferably 10 parts by mass or greater relative to 100 parts by mass of the resin solid content in the resin composition. With the content of the cyanate ester compound being 1 part by mass or greater, the thermal resistance, combustion resistance, chemical resistance, low dielectric constant, low dielectric loss tangent, and insulation of the resulting cured product tend to improve. When the resin composition according to the present embodiments contains the cyanate ester compound, the upper limit of the content of the cyanate ester compound is preferably 70 parts by mass or less, more preferably 50 parts by mass or less, even more preferably 40 parts by mass or less, still more preferably 30 parts by mass or less, and yet still more preferably 20 parts by mass or less relative to 100 parts by mass of the resin solid content in the resin composition.

The resin composition in the present embodiments may contain only one cyanate ester compound or may contain two or more cyanate ester compounds. When two or more types are contained, the total amount thereof is preferably in the above range.

In addition, the resin composition in the present embodiments can also be configured to contain substantially no cyanate ester compound. "To contain substantially no" means that the content of the cyanate ester compound is less than 0.1 parts by mass relative to 100 parts by mass of the resin solid content in the resin composition, and the content is preferably less than 0.01 parts by mass and may be less than 0.001 parts by mass.

<<Elastomer>>

The resin composition according to the present embodiments may contain an elastomer. With the resin composition containing the elastomer, it is possible to improve the low dielectric properties after moisture absorption, the metal foil peel strength, and the like in a well-balanced manner.

In the present embodiments, the elastomer is not particularly limited, and examples include at least one selected from the group consisting of polyisoprene, polybutadiene, styrene-butadiene, butyl rubber, ethylene-propylene rubber, styrene-butadiene-ethylene, styrene-butadiene-styrene, styrene-isoprene-styrene, styrene-ethylene-butylene-styrene, styrene-propylene-styrene, styrene-ethylene-propylene-styrene, fluororubber, silicone rubber, their hydrogenated compounds, their alkyl compounds, and their copolymers.

The elastomer may be a thermoplastic elastomer or a thermosetting elastomer, but is preferably a thermoplastic elastomer.

The number average molecular weight of the elastomer used in the present embodiments is preferably 50000 or greater. With the number average molecular weight of the elastomer being 50000 or greater, the resulting cured product tends to have even better low dielectric properties. The number average molecular weight is preferably 60000 or greater, more preferably 70000 or greater, and even more preferably 80000 or greater. The upper limit of the number average molecular weight of the thermal elastomer is preferably 400000 or less, more preferably 350000 or less, and even more preferably 300000 or less. With the number average molecular weight being not higher than the above upper limit, the solubility of the elastomer component in the resin composition tends to improve.

In a case where the resin composition of the present embodiments contains two or more elastomers, the number average molecular weight of a mixture thereof preferably satisfies the range described above.

In the present embodiments, the elastomer is preferably a thermoplastic elastomer containing a styrene monomer unit and a conjugated diene monomer unit (hereinafter referred to as "thermoplastic elastomer (E)"). When such a thermoplastic elastomer (E) is used, the obtained cured product is more excellent in low dielectric properties.

The thermoplastic elastomer (E) contains a styrene monomer unit. With the thermoplastic elastomer (E) containing the styrene monomer unit, the solubility of the thermoplastic elastomer (E) in the resin composition is improved. Examples of the styrene monomer include styrene, α-methylstyrene, p-methylstyrene, divinylbenzene (vinylstyrene), N, N-dimethyl-p-aminoethylstyrene, and N, N-diethyl-p-aminoethylstyrene. Among these, one or more selected from the group consisting of styrene, α-methylstyrene, and p-methylstyrene is preferable from the viewpoint of availability and productivity. Among them, styrene is particularly preferable.

The content of the styrene monomer unit in the thermoplastic elastomer (E) is preferably in a range of from 10 to 50 mass %, more preferably in a range of from 13 to 45 mass %, and even more preferably in a range of from 15 to 40 mass % of all the monomer units. When the content of the styrene monomer unit is 50 mass % or less, adhesion and pressure sensitive adhesion to a substrate or the like are further improved. In addition, a content of 10 mass % or greater is preferable because there is a tendency that it is possible to suppress an increase in pressure sensitive adhesion, that an adhesive residue or a stop mark is less likely to occur, and that easy peelability between pressure sensitive adhesive surfaces is improved.

The thermoplastic elastomer (E) may contain only one, or two or more styrene monomer units. When two or more types are contained, a total amount thereof is preferably in the above range.

As for a method for measuring the content of the styrene monomer unit in the thermoplastic elastomer (E), reference can be made to WO 2017/126469, the contents of which are incorporated in the present specification. The same applies to the conjugated diene monomer unit and the like which will be described below.

The thermoplastic elastomer (E) contains a conjugated diene monomer unit. With the thermoplastic elastomer (E) containing the conjugated diene monomer unit, the solubility of the thermoplastic elastomer (E) in the resin composition is improved. The conjugated diene monomer is not particularly limited as long as it is a diolefin having a pair of conjugated double bonds. Examples of the conjugated diene monomer include 1,3-butadiene, 2-methyl-1,3-butadiene (isoprene), 2,3-dimethyl-1,3-butadiene, 1,3-pentadiene, 2-methyl-1,3-pentadiene, 1,3-hexadiene, and farnesene; 1,3-butadiene and/or isoprene is preferable; and 1,3-butadiene is more preferable.

The thermoplastic elastomer (E) may contain only one, or two or more conjugated diene monomer units.

In the thermoplastic elastomer (E), a mass ratio of the styrene monomer unit to the conjugated diene monomer unit (styrene monomer unit/conjugated diene monomer unit) is preferably in a range of from 5/95 to 80/20, more preferably in a range of from 7/93 to 77/23, and even more preferably in a range of from 10/90 to 70/30. When the mass ratio of the styrene monomer unit to the conjugated diene monomer unit is in a range of from 5/95 to 80/20, it is possible to suppress an increase in pressure sensitive adhesion and to maintain the pressure sensitive adhesive strength at a high level, and easy peelability between pressure sensitive adhesive surfaces is improved.

In the thermoplastic elastomer (E), all of the conjugated diene bonds of the thermoplastic elastomer may be hydrogenated, some of the conjugated diene bonds may be hydrogenated, or the conjugated diene bonds may not be hydrogenated.

The thermoplastic elastomer (E) may or may not contain an additional monomer unit in addition to the styrene monomer unit and the conjugated diene monomer unit. Examples of the additional monomer unit include an aromatic vinyl compound unit other than the styrene monomer unit.

In the thermoplastic elastomer (E), a total of the styrene monomer unit and the conjugated diene monomer unit is preferably 90 mass % or greater, more preferably 95 mass % or greater, even more preferably 97 mass % or greater, and still more preferably 99 mass % or greater of all the monomer units.

The thermoplastic elastomer (E) may contain only one, or two or more of each of the styrene monomer units and the conjugated diene monomer units. When two or more types are contained, the total amount thereof is preferably in the above range.

The thermoplastic elastomer (E) may be a block polymer or a random polymer. The thermoplastic elastomer (E) may be a hydrogenated elastomer in which the conjugated diene monomer units are hydrogenated, an unhydrogenated elastomer in which the conjugated diene monomer units are not hydrogenated, or a partially hydrogenated elastomer in which the conjugated diene monomer units are partially hydrogenated.

In one embodiment of the present embodiments, the thermoplastic elastomer (E) is a hydrogenated elastomer. Here, the hydrogenated elastomer means, for example, one in which double bonds based on a conjugated diene monomer unit in a thermoplastic elastomer is hydrogenated, and is intended to include one having a hydrogen addition rate (hydrogenation rate) of 80% or greater in addition to one having a hydrogenation rate of 100%. The hydrogenation rate of the hydrogenated elastomer is preferably 85% or greater, more preferably 90% or greater, and even more preferably 95% or greater. In the present embodiments, the hydrogenation rate is calculated from the measurement result of $^1$H-NMR spectrum measurement.

In one embodiment of the present embodiments, the thermoplastic elastomer (E) is an unhydrogenated elastomer. Here, the "unhydrogenated elastomer" is intended to include an elastomer having a proportion of hydrogenated double bonds among double bonds based on conjugated diene monomer units in the elastomer, i.e., a hydrogen addition rate (hydrogenation rate) of 20% or lower. The hydrogenation rate of the unhydrogenated elastomer is preferably 15% or lower, more preferably 10% or lower, and even more preferably 5% or lower.

On the other hand, the partially hydrogenated elastomer means one in which some of double bonds based on the conjugated diene monomer units in a thermoplastic elastomer are hydrogenated, and usually refers to one having a hydrogen addition rate (hydrogenation rate) of lower than 80% and greater than 20%.

The hydrogenation rate is measured by $^1$H-NMR. More specifically, it is measured in accordance with paragraph of JP 2022-054761 A.

[1]

Examples of commercially available products of the thermoplastic elastomer (E) used in the present embodiments include SEPTON (trade name) 2104 available from Kuraray Co., Ltd., S.O.E. (trade name) S1606, S1613, S1609, and S1605 available from Asahi Kasei Corporation, and DYNARON (trade name) 9901P and TR2250 available from JSR Corporation.

When the resin composition according to the present embodiments contains the elastomer (preferably, the thermoplastic elastomer (E)), the content thereof is preferably 1 part by mass or greater, more preferably 3 part by mass or greater, even more preferably 7 parts by mass or greater, still more preferably 10 parts by mass or greater, and yet still more preferably 12 parts by mass or greater, relative to 100 parts by mass of the resin solid content. With the content being not lower than the above lower limit, the low dielectric properties tend to further improve. The upper limit of the content of the elastomer is preferably 35 parts by mass or less, more preferably 30 parts by mass or less, even more preferably 25 parts by mass or less, still more preferably 21 parts by mass or less, and yet still more preferably 18 parts by mass or less relative to 100 parts by mass of the resin solid content. With the content being not higher than the above upper limit, the heat resistance tends to further improve.

The resin composition of the present embodiments may contain only one elastomer or may contain two or more elastomers. When two or more types are contained, the total amount thereof is preferably in the above range.

<<Active Ester Compound>>

The resin composition according to the present embodiments may contain an active ester compound.

The active ester compound is not particularly limited, and examples include compounds having two or more (preferably from 2 to 12, more preferably from 2 to 6, even more preferably from 2 to 4, still more preferably 2 or 3, and yet more preferably 2) active ester groups per molecule.

The active ester compound may be a linear, branched, or cyclic compound. Among these, from the viewpoint of further improving the thermal resistance of the resulting cured product, the active ester compound is preferably an active ester compound obtained by reacting a carboxylic acid compound and/or a thiocarboxylic acid compound with a hydroxy compound and/or a thiol compound; more preferably an active ester compound obtained by reacting a carboxylic acid compound with one or more compounds selected from the group consisting of a phenolic compound, a naphthol compound, and a thiol compound; even more preferably an aromatic compound obtained by reacting a carboxylic acid compound with an aromatic compound having a phenolic hydroxyl group and having two or more active ester groups per molecule; and particularly preferably an aromatic compound obtained by reacting a compound having two or more carboxylic acids per molecule with an aromatic compound having a phenolic hydroxyl group and having two or more active ester groups per molecule.

Examples of the carboxylic acid compound include one or more selected from the group consisting of benzoic acid, acetic acid, succinic acid, maleic acid, itaconic acid, phthalic acid, isophthalic acid, terephthalic acid, and pyromellitic acid. Among these, from the viewpoint of further improving the thermal resistance of the resulting cured product, the carboxylic acid compound is preferably one or more selected from the group consisting of succinic acid, maleic acid, itaconic acid, phthalic acid, isophthalic acid, and terephthalic acid, and more preferably one or more selected from the group consisting of isophthalic acid and terephthalic acid.

Examples of the thiocarboxylic acid compound include one or more selected from thioacetic acid and thiobenzoic acid.

Examples of the phenolic compound or naphthol compound include one or more selected from the group consisting of hydroquinone, resorcin, bisphenol A, bisphenol F, bisphenol S, phenolphthaline, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac. From the viewpoints of further improving the thermal resistance and solubility of the resulting cured product in a solvent, the phenolic compound or naphthol compound is preferably bisphenol A, bisphenol F, bisphenol S, methylated bisphenol A, methylated bisphenol F, methylated bisphenol S, catechol, x-naphthol, 3-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, or phenol novolac; more preferably one or more selected from the group consisting of catechol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac; even more preferably one or more selected from the group consisting of 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol, and phenol novolac; and particularly preferably one or more selected from the group consisting of dihydroxybenzophenone, trihydroxybenzophenone, tetrahydroxybenzophenone, dicyclopentadienyl diphenol, and phenol novolac (preferably one or more selected from the group consisting of dicyclopentadienyl diphenol and phenol novolak, and more preferably dicyclopentadienyl diphenol).

Examples of the thiol compound include one or more selected from the group consisting of benzenedithiol and triazinedithiol.

In addition, from the viewpoint of further improving compatibility with the epoxy compound, the active ester compound is preferably a compound having at least two or more carboxylic acids per molecule and containing an aliphatic chain. From the viewpoint of further improving the thermal resistance, the active ester compound is preferably a compound having an aromatic ring. More specific examples of the active ester compound include the active ester compounds described in JP 2004-277460 A.

A commercially available active ester compound may be used, or the active ester compound may be prepared by a known method. Examples of the commercially available product include compounds containing a dicyclopentadienyl diphenol structure (e.g., such as EXB9451, EXB9460, EXB9460S, and HPC-8000-65T (all available from DIC Corporation)), an acetylated phenol product of phenol novolac (e.g., DC808 (available from Mitsubishi Chemical Corporation)), and a benzoylated product of phenol novolac (e.g., YLH1026, YLH1030, and YLH1048 (all available from Mitsubishi Chemical Corporation)). From the viewpoints of further improving the storage stability of a varnish and the low thermal expansion properties when the resin composition is cured (the low thermal expansion properties of the cured product), EXB9460S is preferred.

The active ester compound can be prepared by a known method and can be obtained, for example, by a condensation reaction of a carboxylic acid compound and a hydroxy compound. Specific examples include a method of reacting (a) a carboxylic acid compound or its halide, (b) a hydroxy compound, and (c) an aromatic monohydroxy compound at a ratio from 0.05 to 0.75 mol of a phenolic hydroxyl group of (b) and from 0.25 to 0.95 mol of (c) per mol of the carboxy group or acid halide group of (a).

The active ester compound is preferably contained within a range that does not impair the effects of the present invention. When the resin composition of the present embodiments contains the active ester compound, the active ester compound is preferably 1 part by mass or more and preferably 90 parts by mass or less relative to 100 parts by mass of the resin solid content in the resin composition.

The resin composition in the present embodiments may contain only one active ester compound or may contain two or more active ester compounds. When two or more types are contained, the total amount thereof is preferably in the above range.

In addition, the resin composition in the present embodiments can also be configured to contain substantially no active ester compound. "To contain substantially no" means that the content of the active ester compound is less than 1 part by mass relative to 100 parts by mass of the resin solid content in the resin composition.

<(D) Filler>

The resin composition according to the present embodiments preferably contains a filler (D). Blending the filler (D) enables further improvement of the low dielectric constant, low dielectric loss tangent, flame resistance, and low thermal expansion properties of the resin composition.

In addition, the filler (D) used in the present embodiments preferably has excellent low dielectric properties. For example, the filler (D) used in the present embodiments has a relative dielectric constant (Dk) measured according to a cavity resonance perturbation method of preferably 8.0 or lower and more preferably 6.0 or lower. Furthermore, the lower limit of the relative dielectric constant is, for example, practically 2.0 or higher. In addition, the filler (D) used in the present embodiments has a dielectric loss tangent (Df) measured according to a cavity resonance perturbation method of preferably 0.05 or lower and more preferably 0.01 or lower. Furthermore, the lower limit of the dielectric loss tangent is, for example, practically 0.0001 or higher.

A kind of the filler (D) used in the present embodiments is not particularly limited, and fillers commonly used in the art can be suitably used as the filler (D). Specifically, examples of the fillers include silica, such as natural silica, fused silica, synthetic silica, amorphous silica, Aerosil, and hollow silica; metal oxides, such as alumina, white carbon, titanium white, zinc oxide, magnesium oxide, and zirconium oxide; nitrides, such as boron nitride, aggregated boron nitride, silicon nitride, and aluminum nitride; metal hydroxides (including hydrates), such as aluminum hydroxide, an aluminum hydroxide heat-treated product (a product obtained by heating aluminum hydroxide to reduce a part of the crystalline water), boehmite, and magnesium hydroxide; molybdenum compounds, such as molybdenum oxide and zinc molybdate; inorganic-based fillers, such as zinc borate, zinc stannate, barium sulfate, clay, kaolin, talc, calcined clay, calcined kaolin, calcined talc, mica, E-glass, A-glass, NE-glass, C-glass, L-glass, D-glass, S-glass, M-glass G20, glass short fibers (including glass fine powders of E glass, T glass, D glass, S glass, Q glass, and the like), hollow glass, and spherical glass; and, in addition, organic-based fillers, such as rubber powders (such as styrene, butadiene, and acrylic rubber powders), core-shell rubber powders, silicone resin powders, silicone rubber powders, and silicone composite powders.

Among these, one kind, or two or more kinds selected from the group consisting of silica, aluminum hydroxide, boehmite, magnesium oxide, and magnesium hydroxide are preferable. Using such a filler improves properties such as the thermal expansion, dimensional stability, and flame retardancy of the resin composition.

A content of the filler (D) in the resin composition of the present embodiments can be appropriately set according to the desired properties and is not particularly limited but is preferably 10 parts by mass or greater, more preferably 25 parts by mass or greater, even more preferably 35 pars by mass or greater, still more preferably 50 parts by mass or greater, and yet still more preferably 75 parts by mass or greater relative to 100 parts by mass of the resin solid content in the resin composition. In addition, the content of the filler (D) is preferably 1600 parts by mass or less, more preferably 1200 parts by mass or less, even more preferably 1000 parts by mass or less, still more preferably 750 parts by mass or less, yet more preferably 500 parts by mass or less, still even more preferably 300 parts by mass or less relative to 100 parts by mass of the resin solid content in the resin composition, and may be 250 parts by mass or less or 200 parts by mass or less.

In the resin composition according to the present embodiments, an aspect in which the content of the filler (D) is from 30 mass % to 80 mass % of components excluding a solvent is exemplified as an example of a preferred embodiment.

The resin composition in the present embodiments may contain only one kind of filler (D) or contain two or more kinds of filler (D). When two or more types are contained, the total amount thereof is preferably in the above range.

When the filler (D) is used in the resin composition according to the present embodiments, a silane coupling agent may be further contained therein. The resin composition containing a silane coupling agent tends to further improve dispersibility of the filler (D) and adhesive strength between the resin components, the filler (D), and a substrate which will be described later.

<Flame Retardant>

The resin composition of the present embodiments may contain a flame retardant.

For the flame retardant, known flame retardants can be used, and examples include halogen-based flame retardants, such as brominated epoxy resins, brominated polycarbonates, brominated polystyrenes, brominated styrenes, brominated phthalimides, tetrabromobisphenol A, pentabromobenzyl (meth) acrylate, pentabromotoluene, tribromophenol, hexabromobenzene, decabromodiphenyl ether, bis-1,2-pentabromophenylethane, chlorinated polystyrenes, and chlorinated paraffins; phosphorus-based flame retardants, such as red phosphorus, tricresyl phosphate, triphenyl phosphate, cresyl diphenyl phosphate, trixylenyl phosphate, trialkyl phosphate, dialkyl phosphate, tris(chloroethyl) phosphate, phosphazene, 1,3-phenylene bis(2,6-dixylenylphosphate), and 10-(2,5-dihydroxyphenyl)-10H-9-oxa-10-phosphaphenanthrene-10-oxide; inorganic-based flame retardants, such as aluminum hydroxide, magnesium hydroxide, partial boehmite, boehmite, zinc borate, and antimony trioxide; and silicone-based retardants, such as silicone rubbers and silicone resins. These flame retardants may be used alone, or two or more in combination. Among these flame retardants, 1,3-phenylene bis(2,6-dixylenylphosphate) does not impair the low dielectric properties and thus is preferable.

When the resin composition of the present embodiments contains the flame retardant, the content of the flame retardant is preferably 0.1 parts by mass or more, and preferably 20 parts by mass or less and more preferably 10 parts by mass or less of the resin composition.

One flame retardant can be used alone, or two or more flame retardants can be used in combination. When two or more solvents are used, the total amount is in the above range.

<Dispersant>

The resin composition of the present embodiments may contain a dispersant. For the dispersant, dispersants commonly used in paints can be suitably used, and the type of dispersant is not particularly limited. For the dispersant, a copolymer-based wet dispersant is preferably used, and its specific examples include DISPERBYK (trade name)-110, 111, 161, 180, 2009, 2152, 2155, BYK (trade name)-W996, W9010, W903, and W940 available from BYK Japan KK.

When the resin composition of the present embodiments contains the dispersant, the lower limit of the content of the dispersant is preferably 0.01 parts by mass or more, more preferably 0.1 parts by mass or more, and may be 0.3 parts by mass or more relative to 100 parts by mass of the resin solid content in the resin composition. The upper limit of the content of the dispersant is preferably 10 parts by mass or less, more preferably 5 parts by mass or less, and even more preferably 3 parts by mass or less relative to 100 parts by mass of the resin solid content in the resin composition.

One dispersant can be used alone, or two or more dispersants can be used in combination. When two or more solvents are used, the total amount is in the above range.

<Curing Accelerator>

The resin composition according to the present embodiments may further contain a curing accelerator. The curing accelerator is not particularly limited, but examples thereof include imidazoles, such as 2-ethyl-4-methylimidazole and triphenylimidazole; organic peroxides, such as benzoyl peroxide, lauroyl peroxide, acetyl peroxide, parachlorobenzoyl peroxide, and di-tert-butyl-di-perphthalate; azo compounds, such as azobisnitrile (especially, azobisisobutyronitrile); tertiary amines, such as N, N-dimethylbenzylamine, N, N-dimethylaniline, N, N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols, such as phenol, xylenol, cresol, resorcin, and catechol; organometallic salts, such as lead naphthenate, lead stearate, zinc naphthenate, zinc octylate, manganese octylate, tin oleate, dibutyltin malate, manganese naphthenate, cobalt naphthenate, and iron acetylacetone; those formed by dissolving these organometallic salts in hydroxyl group-containing compounds, such as phenol and bisphenol; inorganic metal salts, such as tin chloride, zinc chloride, and aluminum chloride; and organotin compounds, such as dioctyl tin oxide and other alkyl tins, and alkyl tin oxides.

Preferred curing accelerators are an imidazole and an organometallic salt, and more preferably both an imidazole and an organometallic salt are used in combination.

When the resin composition of the present embodiments contains the curing accelerator, the lower limit of the content of the curing accelerator is preferably 0.005 parts by mass or more, more preferably 0.01 parts by mass or more, and even more preferably 0.1 parts by mass or more relative to 100 parts by mass of the resin solid content in the resin composition. In addition, the upper limit of the content of the curing accelerator is preferably 10 parts by mass or less, more preferably 5 parts by mass or less, and even more preferably 2 parts by mass or less relative to 100 parts by mass of the resin solid content in the resin composition.

One curing accelerator can be used alone, or two or more curing accelerators can be used in combination. When two or more solvents are used, the total amount is in the above range.

The resin composition according to the present embodiments may be configured to contain substantially no organic peroxide (for example, organic peroxide having a molecular weight of from 30 to 500). "To contain substantially no" means that the content of the organic peroxide is less than 0.1 parts by mass relative to 100 parts by mass of the resin solid content in the resin composition according to the present embodiments, and the content is preferably 0.01 parts by mass or less. Within such a range, a cured product better excelling in various performance aspects can be obtained.

The resin composition according to the present embodiments may be configured to contain substantially no azo compound (for example, azo compound having a molecular weight of from 30 to 500). "To contain substantially no" means that the content of the azo compound is less than 0.1 parts by mass relative to 100 parts by mass of the resin solid content in the resin composition according to the present embodiments, and the content is preferably 0.01 parts by mass or less. Within such a range, a cured product better excelling in various performance aspects can be obtained.

<Solvent>

The resin composition according to the present embodiments may contain a solvent and preferably contains an organic solvent. The resin composition according to the present embodiments containing a solvent is in a form (solution or varnish) in which at least one or some, or preferably all of the various resin solid contents described above are dissolved or homogeneously mixed in the solvent. The solvent includes any polar organic solvent or any non-polar organic solvent capable of dissolving or homogeneously mixing at least one or some, or preferably all of the various resin solid contents described above and is not particularly limited. Examples of the polar organic solvent include ketones (e.g., such as acetone, methyl ethyl ketone, and methyl isobutyl ketone), Cellosolves (e.g., such as propylene glycol monomethyl ether and propylene glycol monomethyl ether acetate), esters (e.g., such as ethyl lactate, methyl acetate, ethyl acetate, butyl acetate, isoamyl acetate, ethyl lactate, methyl methoxypropionate, and methyl hydroxyisobutyrate), and amides (e.g., such as dimethoxyacetamide and dimethylformamide). Examples of the non-polar organic solvent include aromatic hydrocarbons (e.g., such as toluene and xylene).

One solvent can be used alone, or two or more solvents can be used in combination. When two or more solvents are used, the total amount is in the above range.

<Other Components>

The resin composition according to the present embodiments may contain a macromolecular compound of various types, such as a thermoplastic resin and its oligomer, and an additive of various types in addition to the components described above. Examples of the additive include ultraviolet absorbers, antioxidants, polymerization initiators (for example, photopolymerization initiators), fluorescent whitening agents, photosensitizers, dyes, pigments, thickeners, flow control agents, lubricants, defoamers, leveling agents, brighteners, and polymerization inhibitors. One of these additives can be used alone, or two or more can be used in combination.

The resin composition according to the present embodiments may be configured to contain substantially no radical polymerization initiator. "To contain substantially no radical polymerization initiator" means that the content of the radical polymerization initiator is less than 1 part by mass, preferably less than 0.5 part by mass, more preferably less than 0.3 part by mass, and even more preferably less than 0.1 part by mass relative to 100 parts by mass of the resin solid content. The amount of the radical polymerization initiator in the resin composition of the present embodiments is preferably less than 0.01 mass %, more preferably 0.005 mass % or less, even more preferably 0.001 mass % or less, and still more preferably 0 mass % (containing no radical polymerization initiator) relative to 100 mass % of the nonvolatile component in the resin composition. With such a configuration, the electrical properties tend to further improve.

<Applications>

The resin composition of the present embodiments is used as a cured product. Specifically, the resin composition according to the present embodiments can be suitably used as a low dielectric constant material and/or a low dielectric loss tangent material, and as a resin composition for an electronic material, such as an insulating layer of a printed wiring board or a material for a semiconductor package. The resin composition according to the present embodiments can be suitably used as a material for a prepreg, a metal foil-clad laminate formed using the prepreg, a resin sheet, and a printed wiring board.

The resin composition according to the present embodiments is used as a layered material (intended to include a film shape, a sheet shape, and the like), such as a prepreg or a resin sheet serving as an insulating layer of a printed wiring board. When the resin composition is formed into such a layered material, the thickness of the layered material is preferably 5 μm or greater and more preferably 10 μm or greater. The upper limit of the thickness is preferably 200 μm or less and more preferably 180 μm or less. The thickness of the layered material means, for example, a thickness including a glass cloth when the glass cloth or such is impregnated with the resin composition of the present embodiment.

The material formed from the resin composition of the present embodiments may be used in an application to form a pattern by exposure and development or may be used in an application not involving exposure and development. In particular, the material is suitable for an application not involving exposure and development.

<<Prepreg>>

A prepreg according to the present embodiments is formed from a substrate (prepreg substrate) and the resin composition of the present embodiment. The prepreg according to the present embodiments is obtained, for example, by applying the resin composition of the present embodiments to a substrate (e.g., impregnating and/or coating the substrate with the resin composition) and then semi-curing the resin composition by heating (e.g., such as a method of drying at 120 to 220° C. for 2 to 15 minutes). In this case, the amount of the resin composition adhered to the substrate, that is, the amount of the resin composition (including the filler (D)) relative to the total amount of the prepreg after semi-curing is preferably in a range of 20 to 99 mass % and more preferably in a range of 20 to 80 mass %.

The substrate is any substrate used in various printed wiring board materials and is not particularly limited. Examples of the material of the substrate include glass fibers (e.g., such as E-glass, D-glass, L-glass, S-glass, T-glass, Q-glass, UN-glass, NE-glass, and spherical glass), inorganic fibers other than glass (e.g., such as quartz), and organic fibers (e.g., such as polyimide, polyamide, polyester, liquid crystal polyester, and polytetrafluoroethylene). The form of the substrate is not particularly limited, and examples include woven fabrics, nonwoven fabrics, rovings, chopped strand mats, and surfacing mats. A substrate of these can be used alone, or two or more can be used in combination. Among these substrates, from the viewpoint of dimensional stability, the substrate is preferably a woven fabric subjected to ultra fiber opening and fine weaving; from the viewpoints of strength and low water absorption, the substrate is preferably a glass woven fabric with a thickness of 200 μm or less and a mass of 250 g/m$^2$ or less; and from the viewpoint of moisture absorption thermal resistance, the substrate is preferably a glass woven fabric surface-treated with a silane coupling agent or the like, such as an epoxy silane or an aminosilane. From the viewpoint of electrical properties, the substrate is more preferably a low dielectric glass cloth made of a glass fiber, such as a glass fiber of L-glass, NE-glass, or Q-glass, achieving a low dielectric constant and a low dielectric loss tangent.

The low dielectric constant substrate is exemplified by a substrate with a relative dielectric constant of 5.0 or lower (preferably from 3.0 to 4.9). The low dielectric loss tangent substrate is exemplified by a substrate with a dielectric loss tangent of 0.006 or lower (preferably from 0.001 to 0.005). The relative dielectric constant and dielectric loss tangent are values measured at 10 GHz with a perturbation cavity resonator.

<<Metal Foil-Clad Laminate>>

A metal foil-clad laminate according to the present embodiments includes at least one prepreg of the present embodiments and a metal foil disposed on one side or both sides of the prepreg. Examples of the method for producing a metal foil-clad laminate according to the present embodiments include a method of disposing at least one prepreg (preferably stacking two or more prepregs) of the present embodiments, disposing a metal foil on one or both sides of the prepreg, and laminate-molding the metal foil and the prepreg. More specifically, the metal foil-clad laminate can be produced by disposing a metal foil of copper, aluminum, or the like on one side or both sides of the prepreg, and laminate-molding the metal foil and the prepreg. The number of prepreg(s) is preferably from 1 to 10, more preferably from 2 to 10, and even more preferably from 2 to 9. The metal foil is any metal foil used in materials for printed wiring boards and is not particularly limited, but examples include a copper foil, such as a rolled copper foil and an electrolytic copper foil. The thickness of the metal foil (preferably a copper foil) is not particularly limited and may be approximately from 1.5 to 70 μm. Examples of the molding method include methods commonly used in molding a laminate and a multilayer board for a printed wiring board, and more particularly include a method of laminate-molding using a multi-stage press, a multi-stage vacuum press, a continuous molding machine, an autoclave molding machine, or the like at a temperature of approximately 180 to 350° C., a heating time of approximately 100 to 300 minutes, and a surface pressure of approximately 20 to 100 kg/cm$^2$. In addition, the prepreg according to the present embodiments is combined and laminate-molded with a separately produced wiring board for an inner layer and can also be formed into a multilayer board. In a method of manufacturing a multilayer board, a multilayer board can be produced, for example, by disposing copper foils of approximately 35 μm on both sides of one prepreg of the present embodiments, laminate-molding them by the molding method described above, then forming an inner layer circuit, subjecting the inner layer circuit to a blackening treatment to form an inner layer circuit board, then alternately disposing the inner layer circuit board and the prepreg of the present embodiments one by one, and further disposing a copper foil on the outermost layer, followed by lamination molding under the conditions above preferably under vacuum. The metal foil-clad laminate of the present embodiments can be suitably used as a printed wiring board.

The metal foil-clad laminate according to the present embodiments preferably has a low relative dielectric constant (Dk) measured using a cured plate from which the metal foil is etched away. Specifically, the relative dielectric constant (Dk) of the cured plate measured at 10 GHz according to a cavity resonance perturbation method is preferably 3.5 or lower, more preferably 3.0 or lower, and even more preferably 2.5 or lower. The lower limit of the relative dielectric constant (Dk) is not particularly specified but is, for example, practically 2.0 or higher.

In addition, the metal foil-clad laminate according to the present embodiments preferably has a low dielectric loss tangent (Df) measured using a cured plate from which the metal foil is etched away. Specifically, the dielectric loss tangent (Df) measured at 10 GHz according to a cavity resonance perturbation method is preferably 0.0040 or lower, more preferably 0.0030 or lower, and even more preferably 0.0020 or lower. The lower limit of the dielectric loss tangent (Df) is not particularly specified but is, for example, practically 0.0001 or higher.

The relative dielectric constant (Dk) and the dielectric loss tangent (Df) are measured according to methods which will be described in Examples below.

As described above, the cured product of the resin composition for an electronic material obtained using the resin composition according to the present embodiments (resin composition made from a combination of specific components) can have properties excellent in low water absorption in addition to thermal resistance and low dielectric properties (a low dielectric constant and a low dielectric loss tangent) and further excellent in chemical resistance and desmear resistance.

<<Printed Wiring Board>>

A printed wiring board according to the present embodiments is a printed wiring board including an insulating layer and a conductor layer disposed on the surface of the insulating layer, and the insulating layer includes at least one of a layer formed from the resin composition of the present embodiments or a layer formed from the prepreg of the present embodiment. Such a printed wiring board can be manufactured by a common method, and the manufacturing method is not particularly limited. An example of the method of manufacturing the printed wiring board is described below. First, a metal foil-clad laminate such as the metal foil-clad laminate described above is prepared. Next, the surface of the metal foil-clad laminate is subjected to an etching treatment to form an inner layer circuit, and an inner layer substrate is produced. The inner layer circuit surface of the inner layer substrate is subjected to surface treatment to increase the adhesive strength as necessary, then a required number of the prepregs described above are layered on the inner layer circuit surface, a metal foil for an outer layer circuit is further laminated on the outer side, and the laminate is heated, pressurized, and integrally molded. A multilayer laminate is thus manufactured with an insulating layer composed of a substrate and a cured product of the resin composition formed between the inner layer circuit and the metal foil for the outer layer circuit. The multilayer laminate is then subjected to hole formation for a through hole or a via hole, then a plated metal film for conduction between the inner layer circuit and the metal foil for the outer layer circuit is formed on the wall surface of the hole, and furthermore, the metal foil for the outer layer circuit is subjected to an etching treatment to form the outer layer circuit, and thereby the printed wiring board is manufactured.

The printed wiring board obtained in the above manufacturing example is configured to have an insulating layer and a conductor layer formed on the surface of the insulating layer, and the insulating layer is configured to contain the resin composition according to the present embodiments described above and/or its cured product. That is, the prepreg of the present embodiments described above (e.g., a prepreg formed from a substrate and the resin composition of the present embodiments impregnated into or applied onto the substrate) and the layer formed from the resin composition on the metal foil-clad laminate of the present embodiments described above serve as the insulating layer of the present embodiment.

The present embodiments also relates to a semiconductor device including the printed wiring board. As for details of the semiconductor device, reference can be made to paragraphs [0200] to [0202] of JP 2021-021027 A, the contents of which are incorporated in the present specification.

<<Resin Sheet>>

A resin sheet according to the present embodiments includes a layer including a support and the resin composition of the present embodiments disposed on the surface of the support. The resin sheet can be used as a build-up film or a dry film solder resist. The method of manufacturing the resin sheet is not particularly limited, but examples include a method of obtaining a resin sheet by coating (applying) the support with a solution of the resin composition of the present embodiments described above dissolved in a solvent, and then drying.

Examples of the support used here include, but are not limited to, organic-based film substrates, such as polyethylene films, polypropylene films, polycarbonate films, poly(ethylene terephthalate) films, ethylene tetrafluoroethylene copolymer films, as well as release films formed by coating a surface of a film of these with a release agent, and polyimide films; conductive foils, such as copper foils and aluminum foils; and plate-like supports, such as glass plates, steel use stainless (SUS) plates, and fiber-reinforced plastics (FRPs).

Examples of the coating method (applying method) include a method of using a bar coater, a die coater, a doctor blade, a Baker applicator, or the like to coat a support with a solution of the resin composition of the present embodiments dissolved in a solvent. In addition, the support may be released or etched from the resin sheet in which the support and the resin composition are laminated, thereby forming a monolayer sheet. Furthermore, a monolayer sheet can also be obtained without using a support, for example, by feeding a solution of the resin composition of the present embodiments described above dissolved in a solvent into a mold having a sheet-shaped cavity and drying the solution to mold into a sheet shape.

In the production of the monolayer sheet or the resin sheet according to the present embodiments, the drying conditions in removing the solvent are not particularly limited. However, drying at low temperature is likely to cause the solvent to remain in the resin composition, and drying at high temperature allows the curing of the resin composition to proceed, and thus a condition of a temperature of 20° C. to 200° C. for 1 to 90 minutes is preferable. In addition, the monolayer sheet or resin sheet can be used in an uncured state where the solvent is only dried or can be used as necessary in a semi-cured (B-staged) state. Furthermore, the thickness of the resin layer in the monolayer sheet or resin sheet according to the present embodiments can be adjusted by the concentration of the solution of the resin composition of the present embodiments and the coating thickness and is not particularly limited. However, in general, as the thickness of the coating increases, the solvent is likely to remain during drying, and thus the thickness is preferably from 0.1 to 500 μm.

EXAMPLES

The present invention will be described more specifically with reference to examples below. Materials, amounts used, proportions, processing details, processing procedures, and the like described in the following examples can be appropriately changed as long as they do not depart from the spirit of the present invention. Thus, the scope of the present invention is not limited to the specific examples described below.

If a measuring device used in the examples is not readily available due to discontinuation or the like, another device with equivalent performance can be used for measurement.

Synthesis Example 1: Synthesis of Polymer (Va) Having Structural Unit Represented by Formula (V)

Into a reactor were charged 2.25 mol (292.9 g) of divinylbenzene, 1.32 mol (172.0 g) of ethylvinylbenzene, 11.43 mol (1190.3 g) of styrene, and 15.0 mol (1532.0 g) of n-propyl acetate, 600 mmol of a diethyl ether complex of boron trifluoride was added at 70° C., and the mixture was reacted for 4 hours. After the polymerization reaction was stopped with an aqueous sodium bicarbonate solution, the oil layer was washed three times with pure water, devolatilized under reduced pressure at 60° C., and a polymer (va) having a structural unit represented by Formula (V) was collected. The resulting polymer (va) having the structural unit represented by Formula (V) was weighed to confirm that 860.8 g of the polymer (va) having the structural unit represented by Formula (V) was obtained.

The resulting polymer (va) having the structural unit represented by Formula (V) had a number average molecular weight Mn of 2060, a weight average molecular weight Mw of 30700, and a monodispersity Mw/Mn of 14.9. $^{13}$C-NMR and 1H-NMR analyses were performed, and a resonance line originating from each monomer unit was observed in the polymer (va) having the structural unit represented by Formula (V). Based on the NMR measurement results and GC analytical results, the proportions of the structural units of the polymer (va) having the structural unit represented by Formula (V) were calculated as follows.

Structural units derived from divinylbenzene: 20.9 mol % (24.3 mass %)

Structural units derived from ethylvinylbenzene: 9.1 mol % (10.7 mass %)

Structural units derived from styrene: 70.0 mol % (65.0 mass %)

In addition, the proportion of structural units having a residual vinyl group derived from divinylbenzene was 16.7 mol % (18.5 mass %).

Synthesis Example 2: Synthesis of Modified Polyphenylene Ether Compound

<<Synthesis of Bifunctional Phenylene Ether Oligomer>>

In a 12-L vertically long reactor with a stirrer, a thermometer, an air inlet tube, and a baffle plate, 9.36 g (42.1 mmol) of $CuBr_2$, 1.81 g (10.5 mmol) of N,N'-di-t-butylethylenediamine, 67.77 g (671.0 mmol) of n-butyldimethylamine, and 2600 g of toluene were placed, and the mixture was stirred at a reaction temperature of 40° C., and a mixed solution of 129.32 g (0.48 mol) of 2,2',3,3',5,5'-hexamethyl-(1,1'-biphenyl)-4,4'-diol, 878.4 g (7.2 mol) of 2,6-dimethylphenol, 1.22 g (7.2 mmol) of N, N'-di-t-butylethylenediamine, 26.35 g (260.9 mmol) of n-butyldimethylamine dissolved in 2300 g of methanol in advance was added dropwise over 230 minutes while a mixed gas of nitrogen and air with the oxygen concentration adjusted to 8 vol. % was bubbled at a flow rate of 5.2 L/min, with the mixture being stirred. After completion of the dropwise addition, 1500 g of water in which 48.06 g (126.4 mmol) of tetrasodium ethylenediaminetetraacetate had been dissolved was added to cease the reaction. The aqueous layer and the organic layer were separated, and the organic layer was washed with a 1N hydrochloric acid aqueous solution and then with pure water. The resulting solution was concentrated to 50 mass % with an evaporator, and 1981 g of a toluene solution of a bifunctional phenylene ether oligomer (resin "A") was obtained. The resin "A" had a number average molecular weight of 1975 according to a GPC method calibrated with polystyrene standards, a weight average molecular weight of 3514, and a hydroxyl equivalent of 990 according to a GPC method calibrated with polystyrene standards.

<<Synthesis of Modified Polyphenylene Ether Compound>>

In a reactor equipped with a stirrer, a thermometer, and a reflux tube, 833.4 g of a toluene solution of the resin "A", 76.7 g of vinylbenzyl chloride ("CMS-P" available from AGC Seimi Chemical Co., Ltd.), 1600 g of methylene chloride, 6.2 g of benzyldimethylamine, 199.5 g of pure water, and 83.6 g of a 30.5 mass % NaOH aqueous solution were placed, and the mixture was stirred at a reaction temperature of 40° C. After stirring for 24 hours, the organic layer was washed with a 1N aqueous hydrochloric acid solution followed by pure water. The resulting solution was concentrated with an evaporator and added dropwise to methanol for solidification. The solid was collected by filtration and vacuum-dried, and 450.1 g of a modified polyphenylene ether compound was obtained. The modified polyphenylene ether compound had a number average molecular weight of 2250 in terms of polystyrene by a GPC method, a weight average molecular weight of 3920 in terms of polystyrene by a GPC method, and a vinyl group equivalent of 1189 g/vinyl group.

Synthesis Example 3: Synthesis of Naphthol Aralkyl-Type Cyanate Ester Compound (SNCN)

In 1800 g of dichloromethane, 300 g (1.28 mol in terms of OH group) of a 1-naphthol aralkyl resin (available from Nippon Steel & Sumikin Materials Co., Ltd.) and 194.6 g (1.92 mol) of triethylamine (1.5 mol per mol of hydroxy group) were dissolved, and this was used as a solution 1.

While 125.9 g (2.05 mol) of cyanogen chloride (1.6 mol per mol of hydroxy group), 293.8 g of dichloromethane, 194.5 g (1.92 mol) of 36% hydrochloric acid (1.5 mol per mol of hydroxy group), and 1205.9 g of water were kept at a liquid temperature of from −2° C. to −0.5° C. under stirring, the solution 1 was poured over 30 minutes. After completion of pouring of the solution 1, the mixture was stirred at the same temperature for 30 min, then a solution (solution 2) of 65 g (0.64 mol) of triethylamine (0.5 mol per mol of hydroxy group) dissolved in 65 g of dichloromethane was poured over 10 minutes. After completion of pouring the solution 2, the mixture was stirred at the same temperature for 30 minutes, and the reaction was completed.

The reaction solution was then allowed to stand, and the organic phase and the aqueous phase were separated. The resulting organic phase was washed with 1300 g of water 5 times. The electrical conductivity of the wastewater from the fifth water washing was 5 μS/cm, confirming that removable ionic compounds were sufficiently removed by washing with water.

The organic phase after washing with water was concentrated under reduced pressure and finally concentrated to dryness at 90° C. for 1 hour, and 331 g of the target naphthol aralkyl-type cyanate ester compound (SNCN) (orange viscous material) was obtained. The weight average molecular weight of the resulting SNCN was 600. In addition, the IR spectrum of the SNCN showed an absorption (of a cyanate ester group) at 2250 cm-1 and showed no absorption of a hydroxy group.

<<Measurement of Weight Average Molecular Weight and Number Average Molecular Weight>>

The weight average molecular weight and number average molecular weight were measured by gel permeation chromatography (GPC). The measurement was conducted using a liquid feed pump (LC-20AD available from Shimadzu Corporation), a differential refractive index detector (RID-10A available from Shimadzu Corporation), and a GPC column (GPC KF-801, 802, 803, 804, available from Showa Denko Corporation), and also using tetrahydrofuran as a solvent, a flow rate of 1.0 ml/min, a column temperature of 40° C., and a calibration curve by monodispersed polystyrene.

Example 1

Fifty (50) parts by mass of a maleimide compound (ma) ("X9-470" available from DIC Corporation, a compound represented by Formula (M1)) having the following structure, 50 parts by mass of the polymer (va) having the structural unit represented by Formula (V) obtained in Synthesis Example 1, and 0.25 parts by mass of 2-ethyl-4-methylimidazole (catalyst) were dissolved in methylethylketone and mixed, and a varnish was obtained. Each addition amount described above represents the solid content.

Maleimide Compound (Ma)

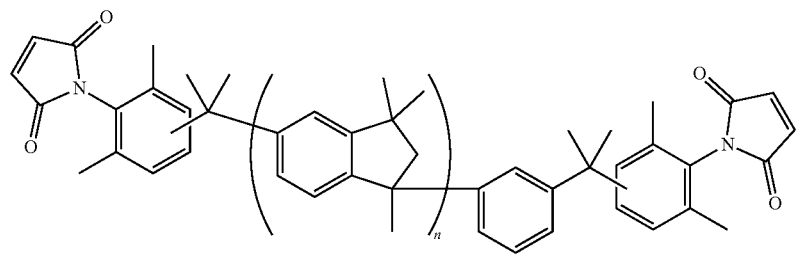

where n is an integer of from 1 to 20.

<Manufacture of Test Piece of Cured Plate with Thickness of 1.6 Mm>

The solvent was distilled off by evaporation from the resulting varnish, and a mixed resin powder was obtained. A mold with a side length of 100 mm and a thickness of 0.8 mm was filled with the mixed resin powder, and 12-μm copper foils (3EC-M2S-VLP available from Mitsui Mining & Smelting Co., Ltd.) were disposed on both sides. The mold was vacuum-pressed at a pressure of 30 kg/cm² and a temperature of 220° C. for 120 minutes, and a cured plate with a side length of 100 mm and a thickness of 0.8 mm was obtained.

The obtained cured plate was used, and the relative dielectric constant (Dk), dielectric loss tangent (Df), and metal foil peel strength were evaluated. The evaluation results are shown in Table 1.

<Methods of Measurement and Evaluation>

(1) Relative Dielectric Constant (Dk) and Dielectric Loss Tangent (Df)

The copper foils of the cured plate were etched away, and the cured plate was cut into 1.0 mm in width and dried at 120° C. for 60 minutes. Thereafter, the relative dielectric constant (Dk) and dielectric loss tangent (Df) at 10 GHz after drying were measured using a perturbation cavity resonator. The measurement temperature was 23° C.

For the perturbation cavity resonator, an Agilent 8722ES available from Agilent Technologies was used.

In addition, copper foils of the cured plate were etched away, and the cure plate was then cut into 1.0 mm in width, and allowed to stand in the presence of saturated water vapor at 121° C. and 2 atm for 3 hours with a pressure cooker tester. Thereafter, the Dk and Df after moisture absorption were measured in the same manner as described above. For the pressure cooker tester, a PC-3 model available from Hirayama Manufacturing Corporation was used.

(2) Metal Foil Peel Strength

The cured plate obtained as described above was cut into 10 mm in width, and the copper foil peel strength (adhesive strength) was measured twice in accordance with 5.7 "Peel Strength" specified in JIS C 6481, and the average value was determined. The measurement temperature was 23° C.

Example 2

The same procedures as in Example 1 were carried out except that the blended amount of the maleimide compound (ma) was 80 parts by mass and the blended amount of the polymer (va) having the structural unit represented by Formula (V) was 20 parts by mass.

Example 3

The same procedures as in Example 1 were carried out except that the blended amount of the maleimide compound (ma) was 30 parts by mass and that the blended amount of the polymer (va) having the structural unit represented by Formula (V) was 70 parts by mass.

Example 4

The same procedures as in Example 1 were carried out except that the blended amount of the maleimide compound (ma) was 30 parts by mass, that the blended amount of the polymer (va) having the structural unit represented by Formula (V) was 30 parts by mass, and further that 5 parts by mass of the modified polyphenylene ether compound obtained in Synthesis Example 2, 5 parts by mass of a maleimide compound (MIR-3000-70MT, available from Nippon Kayaku Co., Ltd.) having the following structure, 5 parts by mass of the naphthol aralkyl-type cyanate ester compound (SNCN) obtained in Synthesis Example 3, 15 parts by mass of a thermoplastic elastomer (SBS, TR2250 available from JSR Corporation), and 10 parts by mass of a phosphorus-based flame retardant (PX-200, 1,3-phenylen-ebis(2,6-dixylenylphosphate) available from DAIHACHI CHEMICAL INDUSTRY CO., LTD.) were blended.

MIR-3000-70MT

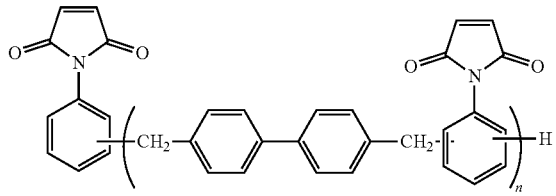

Example 5

The same procedures as in Example 1 were carried out except that the blended amount of the maleimide compound (ma) was 40 parts by mass, that the blended amount of the polymer (va) having the structural unit represented by Formula (V) was 40 parts by mass, and that the blended amount of the thermoplastic elastomer (SBS, TR2250 available from JSR Corporation) was 20 parts by mass.

Comparative Example 1

The same procedures as in Example 1 were carried out except that the blended amount of the maleimide compound (ma) was defined as 100 parts by mass and that the polymer (va) having the structural unit represented by Formula (V) was not blended.

Comparative Example 2

The same procedures as in Example 1 were carried out except that the maleimide compound (ma) was not blended and that the blended amount of the polymer (va) having the structural unit represented by Formula (V) was 100 parts by mass.

Comparative Example 3

The same procedures as in Example 1 were carried out except that the blended amount of the polymer (va) having the structural unit represented by Formula (V) was changed to the same amount of the modified polyphenylene ether obtained in Synthesis Example 2.

Comparative Example 4

The same procedures as in Example 1 were carried out except that the maleimide compound (ma) was changed to the same amount of an additional maleimide compound (MIR-3000-70MT available from Nippon Kayaku Co., Ltd.).

Comparative Example 5

The same procedures as in Example 4 was carried out except that neither the maleimide compound (ma) nor the polymer (va) having the structural unit represented by Formula (V) was blended, and further that 35 parts by mass of a modified polyphenylene ether compound and 35 parts by mass of a maleimide compound (MIR-3000-70MT available from Nippon Kayaku Co., Ltd.) were blended.

TABLE 1

| | | | Examples | | | | |
|---|---|---|---|---|---|---|---|
| | | | 1 | 2 | 3 | 4 | 5 |
| Dielectric properties Cavity resonance method 10 GHz | Dk (—) | After drying | 2.39 | 2.42 | 2.39 | 2.44 | 2.32 |
| | | After moisture absorption | 2.46 | 2.54 | 2.44 | 2.51 | 2.40 |
| | Df (—) | After drying | 0.0013 | 0.0037 | 0.0012 | 0.0019 | 0.0010 |
| | | After moisture absorption | 0.0064 | 0.0103 | 0.0052 | 0.0050 | 0.0047 |
| Peel strength (kN/m) | | | 0.43 | 0.52 | 0.34 | 0.54 | 0.71 |

TABLE 2

|  |  |  | Comparative Examples | | | | |
|---|---|---|---|---|---|---|---|
|  |  |  | 1 | 2 | 3 | 4 | 5 |
| Dielectric properties Cavity resonance method 10 GHz | Dk (—) | After drying | 2.44 | 2.38 | 2.45 | 2.57 | 2.56 |
|  |  | After moisture absorption | 2.59 | 2.40 | 2.52 | 2.71 | 2.66 |
|  | Df (—) | After drying | 0.0047 | 0.0009 | 0.0052 | 0.0021 | 0.0034 |
|  |  | After moisture absorption | 0.0146 | 0.0021 | 0.0110 | 0.0113 | 0.0101 |
| Peel strength (kN/m) | | | 0.57 | 0.14 | 0.35 | 0.55 | 0.61 |

As is clear from the above results, the cured products of the resin compositions of the present embodiments had low Dk and Df. Because it can be said that there is a significant difference when Dk is decreased by 0.1 and when Df is decreased by 0.001, it is seen that the cured products of the resin compositions of the present embodiments achieve remarkably excellent low dielectric properties as compared with the cured products of the resin compositions of Comparative Examples 1, 3, and 4. Further, the cured product of the resin composition of Comparative Example 2 was excellent in low dielectric properties, but remarkably low in copper foil peel strength. The cured products of the resin compositions of the present embodiments achieve low dielectric properties, particularly excellent low dielectric properties after moisture absorption, while achieving high copper foil peel strength.

In particular, while the average value of the Dfs after drying in Comparative Examples 1 and 2 was 0.0028, the cured products of the resin compositions of the present embodiments achieved a Df of 0.0013, which was half or less of the average value. In addition, while the average value of the Dfs after moisture absorption in Comparative Examples 1 and 2 was 0.0084, the cured products of the present embodiments exhibited a remarkably low Df of 0.0064.

The invention claimed is:

1. A resin composition comprising a compound (A) represented by Formula (M1), a polymer (B) having a structural unit represented by Formula (V), and a cyanate ester compound;

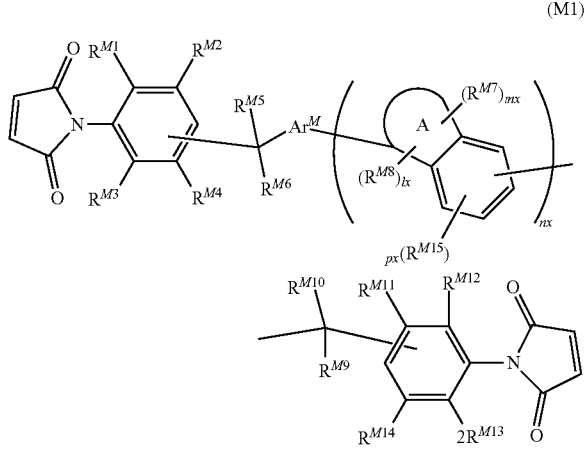

(M1)

where in Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^M$ represents a divalent aromatic group; A is a four-to six-membered alicyclic group; $R^{M7}$ and $R^{M8}$ are each independently an alkyl group; mx is 1 or 2; lx is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group;

$R^{M15}$ each independently represents an alkyl group having from 1 to 10 carbon atom(s), an alkyloxy group having from 1 to 10 carbon atom(s), an alkylthio group having from 1 to 10 carbon atom(s), an aryl group having from 6 to 10 carbon atoms, an aryloxy group having from 1 to 10 carbon atom(s), an arylthiol group having from 1 to 10 carbon atom(s), a halogen atom, a hydroxyl group, or a mercapto group; px represents an integer of from 0 to 3; and nx represents an integer of from 1 to 20,

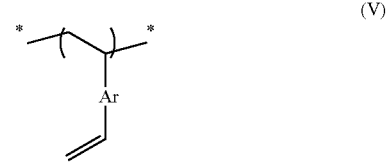

(V)

wherein Formula (V), Ar represents an aromatic hydrocarbon linking group; and * represents a bond position, where a vinyl group equivalent of the unit represented by the Formula (V) is 200 g/eq or more and 1200 g/eq or less.

2. The resin composition according to claim 1, wherein, when a resin solid content in the resin composition is defined as 100 parts by mass, a content of the compound (A) represented by Formula (M1) is from 1 to 90 parts by mass.

3. The resin composition according to claim 1, wherein, when a resin solid content in the resin composition is defined as 100 parts by mass, a content of the polymer (B) having the structural unit represented by Formula (V) is from 1 to 90 parts by mass.

4. The resin composition according to claim 1, further comprising at least one additional resin component (C) selected from the group consisting of: a maleimide compound other than the compound (A) represented by Formula (M1); an epoxy compound; a phenolic compound; an oxetane resin, a benzoxazine compound; a polyphenylene ether compound containing two or more unsaturated carbon-carbon double bonds; and a cyanate ester compound.

5. The resin composition according to claim 1, further comprising a filler (D).

6. The resin composition according to claim 5, wherein a content of the filler (D) in the resin composition is from 50 to 1600 parts by mass relative to 100 parts by mass of a resin solid content.

7. The resin composition according to claim 1, wherein a weight average molecular weight of the polymer (B) having the structural unit represented by Formula (V) is from 3000 to 130000.

8. The resin composition according to claim 1, further comprising an elastomer.

9. The resin composition according to claim 1, which does not comprise a radical polymerization initiator.

10. The resin composition according to claim 1, wherein, when a resin solid content in the resin composition is defined as 100 parts by mass, a content of the compound (A) represented by Formula (M1) is from 1 to 90 parts by mass, and
when a resin solid content in the resin composition is defined as 100 parts by mass, a content of the polymer (B) having the structural unit represented by Formula (V) is from 1 to 90 parts by mass.

11. The resin composition according to claim 10, further comprising an elastomer.

12. The resin composition according to claim 10, which does not comprise a radical polymerization initiator.

13. The resin composition according to claim 1, wherein the polymer (B) having the structural unit represented by Formula (V) has (Mw/Mn), a monodispersity represented by a ratio of a weight average molecular weight Mw to a number average molecular weight Mn, of 10 or more and 20 or less.

14. A compound as in claim 1, where polymer (B) further comprises a structural unit (b) derived from an aromatic compound having one vinyl group, and polymer (B) having a copolymerization ratio of structural unit (b) is 10 mol % or greater and 85 mol % or less.

15. A cured product of a resin composition described in claim 1.

16. A metal foil-clad laminate comprising at least one prepreg described in claim 15 and a metal foil disposed on one side or both sides of the prepreg.

17. A resin sheet comprising a layer comprising a support and a resin composition described in claim 1 disposed on a surface of the support.

18. A printed wiring board comprising an insulating layer and a conductor layer disposed on a surface of the insulating layer,
wherein the insulating layer comprises a layer comprising a resin composition described in claim 1.

19. A prepreg comprising a substrate and a resin composition described in claim 1.

* * * * *